United States Patent
Sekiguchi

(10) Patent No.: US 8,420,993 B2
(45) Date of Patent: Apr. 16, 2013

(54) OPTICAL SIGNAL GENERATOR AND METHOD FOR ADJUSTING THE SAME HAVING A REFLECTING MIRROR TO DEFINE ANOTHER CAVITY DIFFERENT FROM THE CAVITY OF A SINGLE MODE LASER

(75) Inventor: Shigeaki Sekiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 13/152,779

(22) Filed: Jun. 3, 2011

(65) Prior Publication Data

US 2011/0233379 A1    Sep. 29, 2011

Related U.S. Application Data

(63) Continuation of application No. PCT/JP2008/073814, filed on Dec. 26, 2008.

(51) Int. Cl.
*G01J 1/32* (2006.01)
(52) U.S. Cl.
USPC ............................ 250/205; 250/227.19
(58) Field of Classification Search .................. 250/205, 250/216, 227.19, 227.18, 214 R, 214 A; 372/26, 372/38.1, 96, 97; 398/186–188, 195–199
See application file for complete search history.

(56) References Cited

U.S. PATENT DOCUMENTS

| 4,864,577 | A | * | 9/1989 | Aoshima et al. ............... 372/18 |
| 5,385,777 | A | | 1/1995 | Higuchi et al. |
| 6,031,860 | A | | 2/2000 | Nitta et al. |
| 6,963,685 | B2 | | 11/2005 | Mahgerefteh et al. |

FOREIGN PATENT DOCUMENTS

| JP | 6-61564 A | 3/1994 |
| JP | 7-122723 A | 5/1995 |
| JP | 9-148684 A | 6/1997 |
| JP | 2006-516075 A | 6/2006 |

OTHER PUBLICATIONS

D. Mahgerefteh et al., "Error-Free 250km transmission in standard fibre using compact 10 Gbit/s chirp-managed directly modulated lasers (CML) at 1550 nm"; Electronics Letters, vol. 41, No. 9; 2 pages, Apr. 28, 2005.
International Search Report of PCT/JP2008/073814, date of mailing Mar. 24, 2009.

* cited by examiner

*Primary Examiner* — Que T Le
(74) *Attorney, Agent, or Firm* — Westerman, Hattori, Daniels & Adrian, LLP

(57) ABSTRACT

An optical signal generator includes a single-mode laser; a reflecting mirror to define another cavity different from a cavity of the single-mode laser, and reflect a part of output light from the single-mode laser to return the part of the output light to the single-mode laser; an intensity modulator provided between the single-mode laser and the reflecting mirror; and a phase adjuster, provided between the single-mode laser and the reflecting mirror, to adjust a frequency difference between a signal on state and a signal off state generated in accordance with intensity modulation by the intensity modulator.

20 Claims, 17 Drawing Sheets

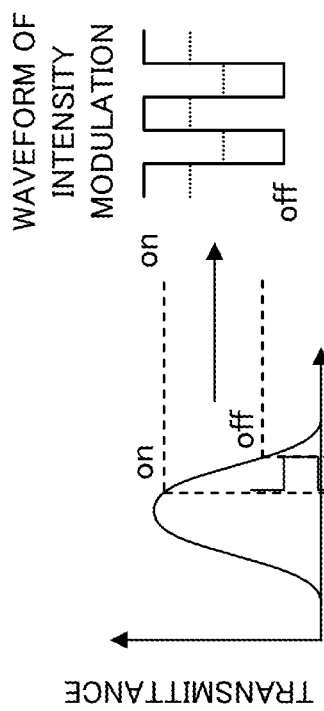
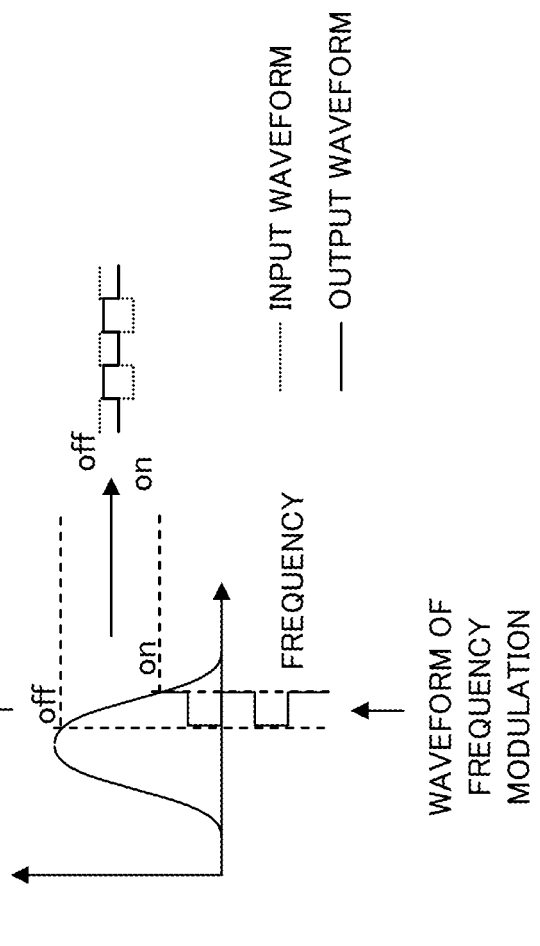
FIG. 5A
FIG. 5B

OPTICAL SIGNAL GENERATOR AND METHOD FOR ADJUSTING THE SAME HAVING A REFLECTING MIRROR TO DEFINE ANOTHER CAVITY DIFFERENT FROM THE CAVITY OF A SINGLE MODE LASER

CROSS-REFERENCE TO RELATED APPLICATION

This application is a continuation Application of a PCT international application No. PCT/JP2008/073814 filed on Dec. 26, 2008 in Japan, the entire contents of which are incorporated by reference.

FIELD

The embodiments discussed herein are related to an optical signal generator and a method of adjusting the same.

BACKGROUND

In long-distance transmissions with higher speeds of 10 Gb/s or greater, the phase state, namely, change in the frequency (wavelength) over time (chirp) is pivotal, not to mention the contrast between the on state and the off state (extinction ratio) generated by intensity modulation.

Particularly, it is desirable to set the frequency difference between the signal on state and the signal off state (frequency modulation amplitude) generated by intensity modulation so as to reduce waveform distortions caused by the wavelength dispersion experienced by optical signals propagating through an optical fiber.

Furthermore, optical fiber communication systems have been proposed, which include an optical signal source configured to generate partially frequency modulated signals and a wavelength filter configured to convert the partially frequency modulated signals into substantially amplitude modulated signals, in order to compensate for scattering in an optical fiber.

Such optical fiber communication systems employ various types of optical signal sources for generating partially frequency modulated signals, such as a directly modulated laser (see FIG. 17A), an external phase modulator (MOD) (see FIG. 17B), and a tunable laser (see FIG. 17C). See D. Mahgerefteh et al., "Error-free 250 km transmission in standard fiber using compact 10 Gbit/s chirp-managed directly modulated lasers (CML) at 1550 nm", ELECTRONICS LETTERS, 28 Apr. 2005, Vol. 41, No. 9; and Japanese Translation of PCT International Application No. 2006-516075, the entire contents of which are incorporated herein by reference.

SUMMARY

Accordingly, an optical signal generator includes a single-mode laser; a reflecting mirror to define another cavity different from a cavity of the single-mode laser, and reflect a part of output light from the single-mode laser to return the part of the output light to the single-mode laser; an intensity modulator provided between the single-mode laser and the reflecting mirror; and a phase adjuster, provided between the single-mode laser and the reflecting mirror, to adjust a frequency difference between a signal on state and a signal off state generated in accordance with intensity modulation by the intensity modulator.

Furthermore, a method of adjusting an optical signal generator includes: disposing a single mode laser, and a reflecting mirror to define another cavity different from a cavity of the single-mode laser, and to reflect a part of output light from the single-mode laser to return the part of the output light to the single-mode laser, and disposing an intensity modulator and a phase adjuster between the single-mode laser and the reflecting mirror; and adjusting, with the phase adjuster, a frequency difference between a signal on state and a signal off state generated in accordance with intensity modulation by the intensity modulator.

BRIEF DESCRIPTION OF DRAWINGS

FIGS. 5A and 5B are diagrams illustrating the transmission characteristic of a wavelength filter provided in the optical signal generator according to the first embodiment, as well as illustrating conversion from a frequency modulated waveform to an intensity modulated waveform by the wavelength filter;

DESCRIPTION OF EMBODIMENTS

Figure 17A:
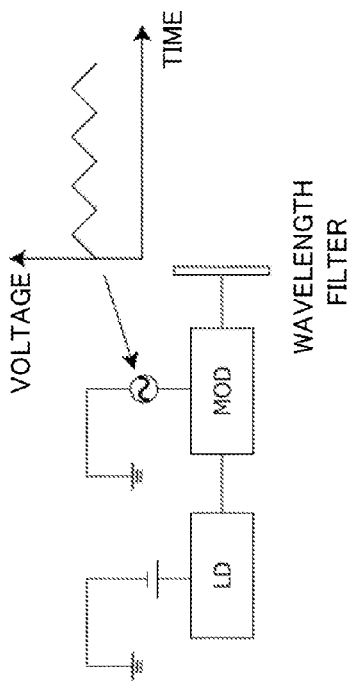
FIGS. 17A to 17C are schematic diagrams illustrating optical fiber communication systems including various types of conventional optical signal sources to generate partially frequency modulated signals.

In systems employing a directly modulated laser (see FIG. 17A), by direct modulation, the carrier density within the laser changes, and the output wavelength (output frequency) changes in accordance with on/off of a signal, as a result, partially frequency modulated signals are generated.

However, when employing a direct modulation laser, generally, since dynamic wavelength variation (dynamic wavelength chirp) upon rising and falling during direct modulation is large, the transmission distance is restricted.

Furthermore, the amplitude of partially frequency modulated signals (frequency modulation amplitude) is dependent on a device structure. On the other hand, an optimal frequency modulation amplitude is dependent on the bit rate of modulated signals. For this reason, a device structure designed using the optimal frequency modulation amplitude determined in accordance with the bit rate of modulated signals (modulation bit rate) is not capable of accommodating other modulation bit rates (i.e., the device structure has no flexibility to modulation bit rates).

Figure 17B:
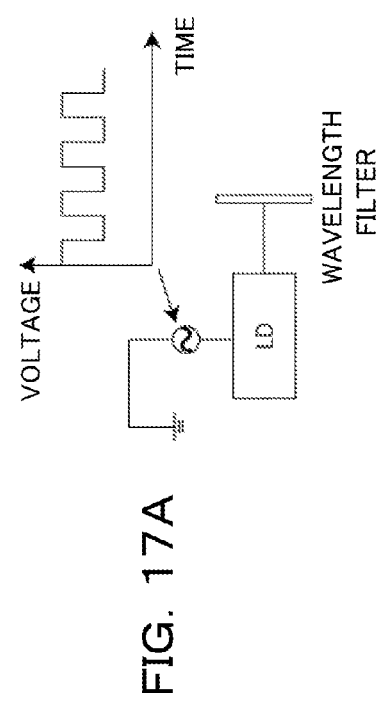

In systems employing an external phase modulator (see FIG. 17B), since the slope of phase modulated signals determines frequency modulated signals, phase modulated signals having constantly changing voltages are used as driving signals for the external phase modulator to generate partially frequency modulated signals, in order to obtain a desired frequency modulated waveform.

Generation of such signals, however, is not easy, and accordingly such a system is impractical.

Figure 17C:
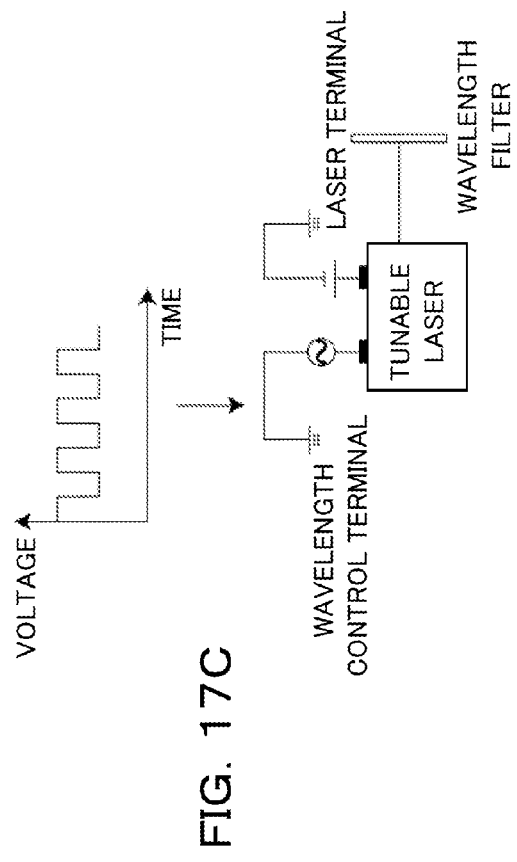

In systems employing a tunable laser (see FIG. 17C), frequency modulated signals are supplied to the wavelength control terminal of the tunable laser at a higher speed to generate partially frequency modulated signals.

However, absence of intensity modulation necessitates a filter having a sharp profile (characteristic) in order to obtain a sufficient extinction ratio of light passing through the filter, but such a filter requires a complex manufacturing process and its manufacturing is difficult.

Furthermore, all of the above-described configurations have difficulty in independently controlling frequency modulation and intensity modulation.

Therefore, it is desirable to adjust the frequency difference between the signal on state and the signal off state (frequency modulation amplitude) generated by intensity modulation independently from intensity modulation, with a simplified and practical structure exhibiting a smaller dynamic wavelength chirp, thereby suppressing distortion of waveforms to increase the transmission distance, in addition to accommodating different modulation bit rates.

Hereinafter, an optical signal generator and a method for adjusting the same according to embodiments will be described with reference to the drawings.

First Embodiment

An optical signal generator and a method for adjusting the same according to a first embodiment will be described with reference to FIGS. 1-8.

Figure 1:
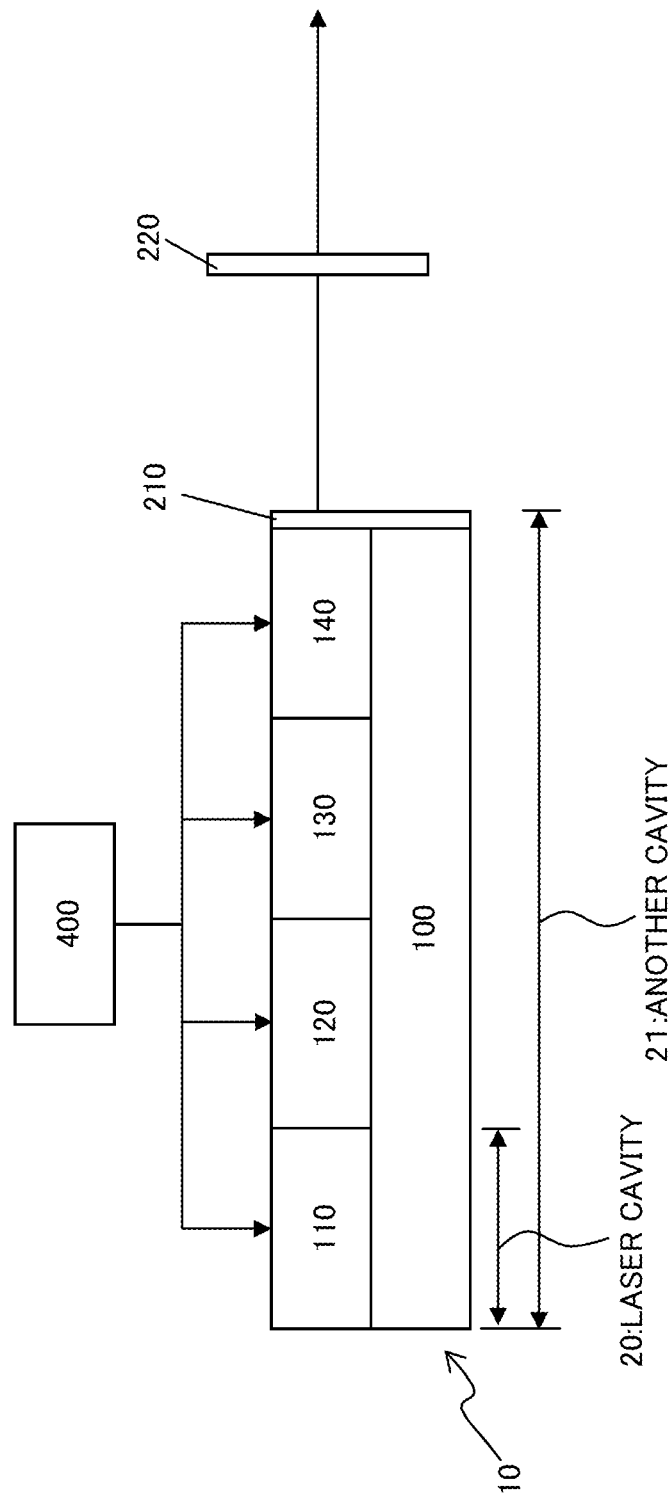
FIG. 1 is a schematic view illustrating a configuration of an optical signal generator according to a first embodiment.

The optical signal generator according to the present embodiment can be used as an optical transmitter in an optical fiber communication system, for example, and includes a single-mode laser 110, a phase adjuster (phase shifter) 120, an optical amplifier 130, an intensity modulator 140, a reflecting mirror 210, and a wavelength filter 220, as depicted in FIG. 1.

After light output from the single-mode laser 110 propagates through the phase adjuster 120, the optical amplifier 130, and the intensity modulator 140, the light passes through the reflecting mirror 210 and the wavelength filter 220, and then being output as output light from the optical signal generator. At the same time, a part of the light output from the single-mode laser 110 is reflected by the reflecting mirror 210 and is returned to the single-mode laser 110.

In the present embodiment, as depicted in FIG. 1, the single-mode laser 110, the phase adjuster 120, the optical amplifier 130, and the intensity modulator 140 are provided over a single substrate (i.e., semiconductor substrate, such as an n-type InP substrate) 100, in this order, and are optically coupled with each other, thereby configuring an integrated device 10. One of the end faces of the integrated device 10 (i.e., the end face emitting the output light, the end face of the intensity modulator 140 in this embodiment) is provided with a reflecting film to function as the reflecting mirror 210.

Here, the single-mode laser 110 is a semiconductor laser used for telecommunications, for example, and is a distributed feedback (DFB) laser here.

The reflecting mirror 210 is a reflecting film, such as a dielectric multilayer, for example, and functions to reflect a part of the output light from the single-mode laser 110 and to return the part of the output light to the single-mode laser 110. Here, the reflectivity of the reflecting mirror 210 is approximately 0.1%.

The reflecting mirror 210 and a reflecting mirror (not illustrated), provided on the side opposite to where the output light of the single-mode laser 110 is emitted, define another cavity 21 different from a cavity (laser cavity) 20 of the single-mode laser 110. This means that this optical signal generator includes a composite cavity having the laser cavity 20 and the other cavity 21.

The phase adjuster (phase controller) 120 is a semiconductor phase modulator, and has a structure to adjust the phase by injecting a current into a quantum well waveguide having a quantum well structure as a core layer, thereby changing the refractive index, for example. The phase adjuster 120 is provided between the single-mode laser 110 and the reflecting mirror 210. In other words, the phase adjuster 120 is provided within the other cavity 21.

In the present embodiment, the phase adjuster 120 is used to adjust the frequency difference between the signal on state and the signal off state (frequency modulation amplitude) generated in accordance with the intensity modulation by the intensity modulator 140.

The optical amplifier 130 may be a semiconductor optical amplifier (SOA) that generates a gain by injecting a current into a quantum well waveguide structure, for example, and is provided between the single-mode laser 110 and the reflecting mirror 210. In other words, the optical amplifier 130 is provided within the other cavity 21. Here, the optical amplifier 130 has a gain of approximately 5 dB.

The intensity modulator 140 is a semiconductor electroabsorption modulator to perform intensity modulation by applying a voltage on a quantum well waveguide structure, thereby changing the absorbing coefficient, for example, and is provided between the single-mode laser 110 and the reflecting mirror 210. In other words, the intensity modulator 140 is provided within the other cavity 21 different from the laser cavity 20. Here, the intensity modulator 140 has an insertion loss of approximately 5 dB. This means that the intensity modulator 140 has a loss of approximately 5 dB when the light is not extinct. In this manner, the present embodiment employs external modulation, instead of direct modulation, therefore exhibits a reduced dynamic wavelength chirp.

In the optical signal generator constructed as described above, the frequency difference between the signal on state and the signal off state (frequency modulation amplitude) generated in accordance with the intensity modulation by the intensity modulator 140 varies in accordance with phase. Accordingly, the frequency difference between the signal on state and the signal off state (frequency modulation amplitude) can be adjusted by the phase adjuster 120.

The wavelength filter 220 is an optical band pass filter constructed from a dielectric multilayer, for example, and is provided where the light (optical signal) passing through the reflecting mirror 210 enters (i.e., where the output light from the integrated device 10 optically couples).

The wavelength filter 220 functions to convert the frequency modulation generated in accordance with the intensity modulation by the intensity modulator 140 (frequency modulated waveform, frequency modulated component) to intensity modulation (intensity modulated waveform). Note that an intensity modulation component (intensity modulated waveform) of an optical signal entering to the wavelength filter 220 is not affected by the wavelength filter 220, and the intensity modulation component before entering to the wavelength filter 220 is maintained after the signal exits the wavelength filter 220. The wavelength filter 220 has a transmission band that is the same as that of any of channels used in wavelength-multiplexed communications. Although a transmission-type filter is used as the wavelength filter 220 in this embodiment, a reflection-type filter may also be used.

Since the optical signal generator according to the present embodiment is configured as described above, it operates as follows.

More specifically, in this optical signal generator, light emitted from the single-mode laser 110 propagates through the phase adjuster 120, is amplified by the optical amplifier 130, and then reaches the reflecting mirror 210 through the intensity modulator 140, as depicted in FIG. 1. The reflecting mirror 210 reflects the light (optical signal) towards the single-mode laser 110, and the magnitude of the reflection depends on the reflectivity of the reflecting mirror 210. The reflected light propagates through the intensity modulator 140, is then amplified by the optical amplifier 130, and enters the single-mode laser 110 through the phase adjuster 120.

Having the structure as described above, this optical signal generator (integrated device) includes the other cavity 21 extending from the single-mode laser 110 to the reflecting mirror 210, in addition to the laser cavity 20 of the single-mode laser 110, and has a cavity frequency and a threshold current different from those of the cavity of the single-mode laser 110. The oscillation frequency of the composite cavity constructed from the two cavities 20 and 21 varies due to a change in the cavity frequency and a change in the internal carrier density caused by a variation of the threshold current.

Figure 2:
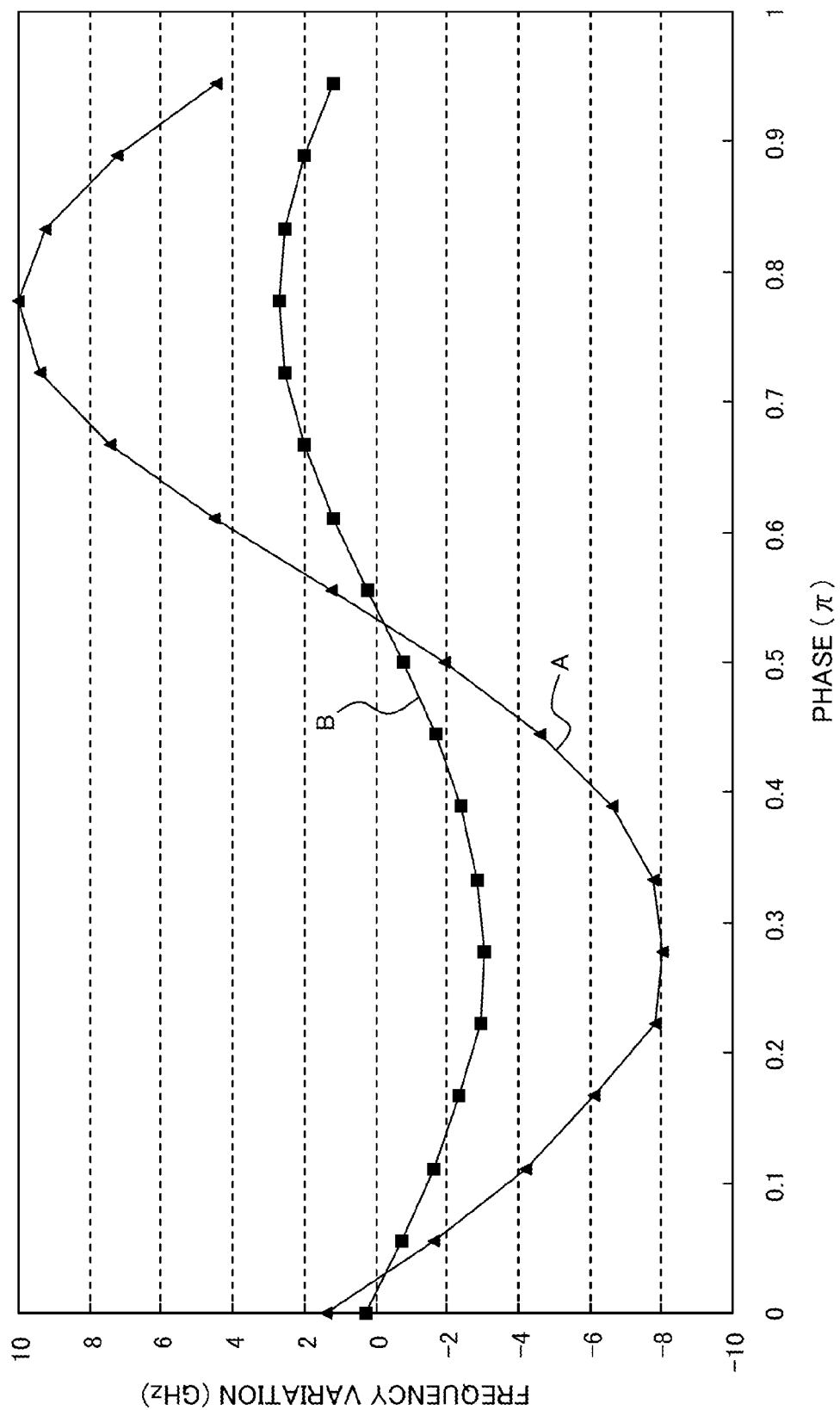
FIG. 2 is a diagram illustrating a frequency variation when the phase is adjusted in the optical signal generator according to the first embodiment.

In other words, the oscillation frequency of the composite cavity (integrated device 10) varies in accordance with phase, as depicted in FIG. 2. In FIG. 2, the solid line A indicates the frequency variation in the signal on state (without extinction by the modulator), while the solid line B indicates the frequency variation in the signal off state (extinct by approximately 5 dB with respect to the case without extinction by the modulator). FIG. 2 also depicts how much the oscillation frequency varies with respect to the oscillation frequency (frequency variation of 0 GHz) of the single-mode laser 110, and it is assumed that positive frequency variation values (GHz) represent increasing frequencies, whereas negative frequency variation values represent decreasing frequencies.

Figure 3:
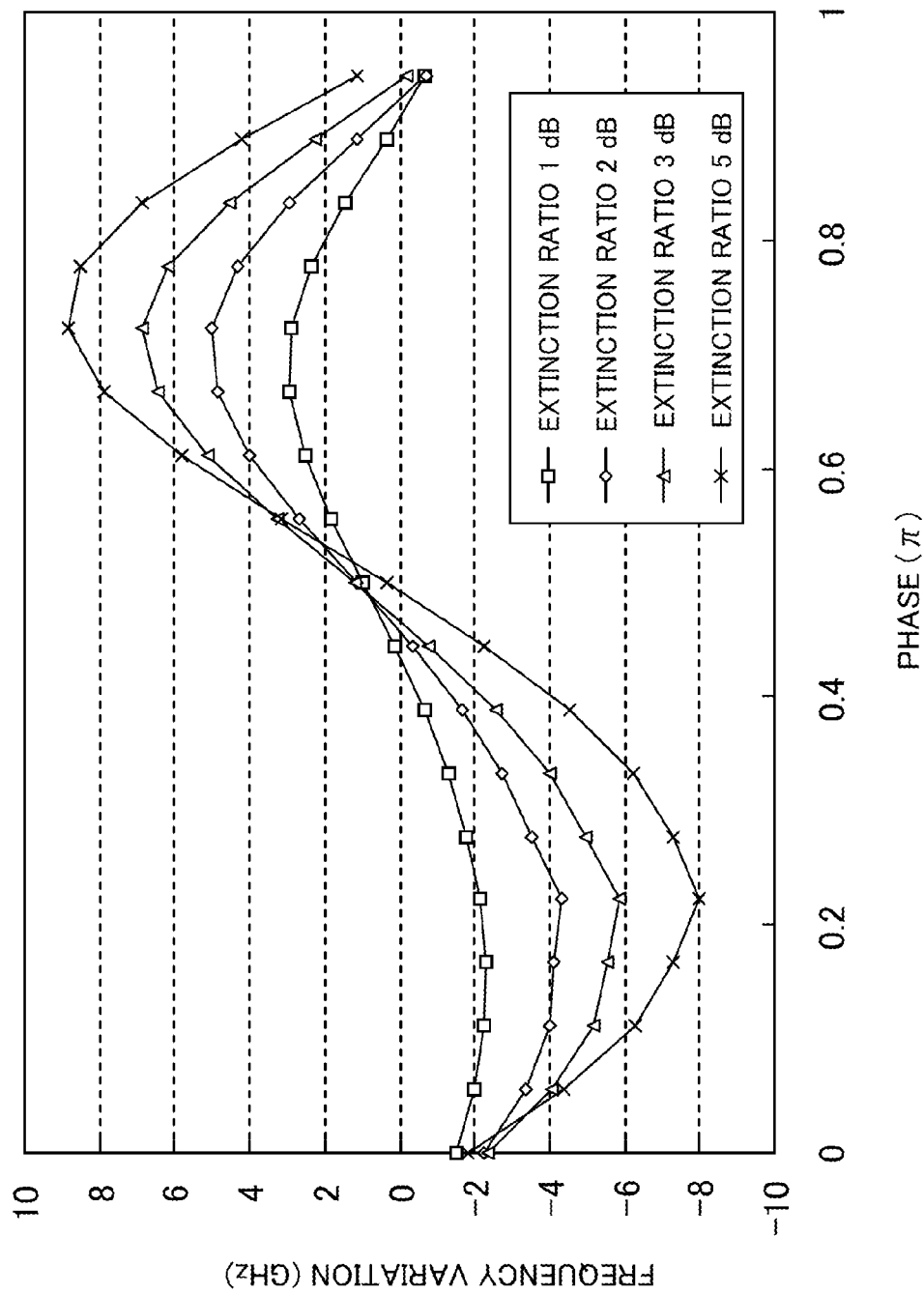
FIG. 3 is a diagram illustrating a frequency modulation amplitude variation when the phase is adjusted in the optical signal generator according to the first embodiment.

It means that, in response to intensity modulation by the intensity modulator 140 by changing a signal applied to the intensity modulator 140, the phase and the intensity of the light returning to the single-mode laser 110 vary, which causes a difference in the oscillation frequency between in the signal on state and the signal off state. In other words, frequency modulation is made. In addition, as depicted in FIG. 2, each of the oscillation frequency in the signal on state and the oscillation frequency in the signal off state varies in accordance with phase. Since the variation ranges of the oscillation frequencies in the signal on state and the signal off state in response to a change in the phase are different, the oscillation frequency difference (frequency modulation amplitude) between the signal on state and the signal off state also varies in accordance with phase, as depicted in FIG. 3. In addition, as depicted in FIG. 3, the changes in the magnitude of the frequency modulation amplitude with respect to the change in the phase are different in accordance with extinction ratios by the intensity modulator 140. Thus, a desired frequency modulation amplitude can be obtained by properly controlling the phase adjuster 120 and the intensity modulator 140. In FIG. 3, the values of frequency modulation amplitude (GHz) on the vertical axis are obtained by subtracting frequencies in signal off state from frequencies in the signal on state.

Accordingly, the light (optical signal) passing through the reflecting mirror 210 contains a frequency modulated component (frequency modulated light). This frequency modulated light is converted to intensity modulated light by the wavelength filter 220 when passing through the wavelength filter 220, and is then output as output light of the optical signal generator.

More specifically, when the phase is shifted in a range from about 0 to about 0.5π, the values of frequency modulation amplitude are negative, and the frequencies in the signal off state are greater than the frequencies in the signal on state, as depicted in FIG. 3. In contrast, when the phase is shifted in a range from about 0.5π to about π, the values of frequency modulation amplitude are positive, and the frequencies in the signal off state are lower than the frequencies in the signal on state.

The transmission characteristic of the wavelength filter 220 has a mountain-shaped curve with respect to the frequency, as depicted in FIGS. 5A and 5B. In addition, the oscillation frequency of the single-mode laser 110 is tuned near the center of the slope of the transmission characteristic of the wavelength filter 220.

Accordingly, as depicted in FIG. 5B, when the phase is shifted in a range from about 0 to about 0.5π, more light passes through the wavelength filter 220 in the wavelength of the light entering to the wavelength filter 220 in the signal off state than in the wavelength of the light entering to the wavelength filter 220 in the signal on state. In such a case, a remarkably increasing output extinction ratio cannot be obtained, since the intensity modulated waveform (input waveform indicated with the dotted line in FIG. 5B) generated by the intensity modulator 140 and entering to the wavelength filter 220 is superimposed with the intensity modulated waveform converted and generated by the wavelength filter 220 and the two waveforms undergo destructive interference, and are output as the intensity modulated waveform (output waveform indicated with the solid line in FIG. 5B).

In contrast, when the phase is shifted in a range from about 0.5π to about π, more light passes through the wavelength filter 220 in the wavelength of the light entering to the wavelength filter 220 in the signal on state than in the wavelength of the light entering to the wavelength filter 220 in the signal off state, as depicted in FIG. 5A. In such a case, a higher output extinction ratio can be obtained, since the intensity modulated waveform (input waveform indicated with the dotted line in FIG. 5A) generated by the intensity modulator 140 and entering to the wavelength filter 220 is superimposed with the intensity modulated waveform converted and generated by the wavelength filter 220 and the two waveforms undergo constructive interference, and are output as the intensity modulated waveform (output waveform indicated with the solid line in FIG. 5A).

Figure 4:
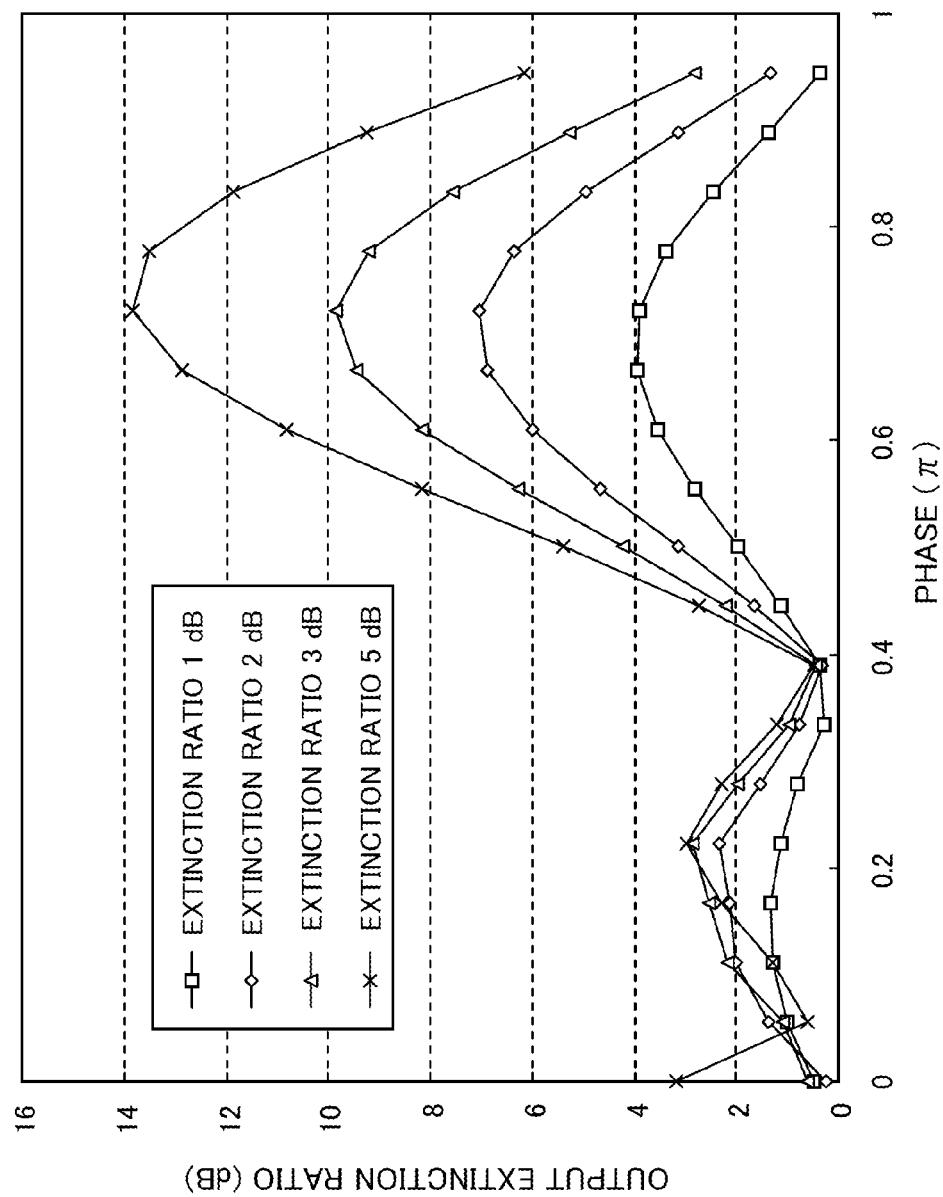
FIG. 4 is a diagram illustrating a change in the output extinction ratio when the phase is adjusted in the optical signal generator according to the first embodiment.

Here, FIG. 4 indicates the relationship between the extinction ratio of the optical signal after passing through the wavelength filter 220 (extinction ratio of the optical signal output via the wavelength filter 220, output extinction ratio) and the phase, in various extinction ratios by the intensity modulator 140.

When the phase is shifted in a range from about $0.5\pi$ to about $\pi$, a desired output extinction ratio can be obtained even if the extinction ratio by the intensity modulator 140 is low, since the output extinction ratio is the sum of the extinction ratio by the intensity modulator 140 and the extinction ratio obtained by the wavelength filter 220, as depicted in FIG. 4. Especially, since the amplitude of the frequency modulated signal entering to the wavelength filter 220 (frequency modulation amplitude) varies in accordance with phase (see FIG. 3), the amplitude of the intensity modulated signal output via the wavelength filter 220 (i.e., output extinction ratio) also varies in accordance with phase, as depicted in FIG. 4. In addition, as depicted in FIG. 4, the change in the output extinction ratio with respect to the change in the phase varies in accordance with the extinction ratio by the intensity modulator 140. Thus, the output extinction ratio can be adjusted by properly controlling the phase adjuster 120 and the intensity modulator 140, and accordingly, a desired output extinction ratio can be obtained.

As described above, a desired frequency modulation amplitude and a desired extinction ratio can be attained by controlling the phase adjuster 120 and the intensity modulator 140, while matching the oscillation frequency of the single-mode laser 110 with the operating wavelength of the wavelength filter 220 (here, the frequency near the center of the slope of the transmission characteristic of the wavelength filter 220).

It is noted that this optical signal generator includes a control circuit (controller) 400 to control each of the components 110, 120, 130, and 140.

Particularly, in the present embodiment, the control circuit 400 is configured to control the phase adjuster 120 such that the frequency difference between the signal on state and the signal off state (frequency modulation amplitude) generated in accordance with the intensity modulation by the intensity modulator 140 becomes a desired frequency difference (frequency modulation amplitude).

Here, the control circuit 400 is configured to control the phase adjuster 120 such that the frequency difference between the signal on state and the signal off state (frequency modulation amplitude) generated in accordance with the intensity modulation by the intensity modulator 140 becomes a frequency difference corresponding to a bit rate. For example, the frequency difference (GHz) between the signal on state and the signal off state (frequency modulation amplitude) generated in accordance with the intensity modulation by the intensity modulator 140 is preferably set to the half of the bit rate (Gbps), in order to maintain the signal quality.

In addition, the control circuit 400 is configured to control the phase adjuster 120 such that the extinction ratio of the light output via the wavelength filter 220 (output extinction ratio) becomes a desired value.

Figure 6:
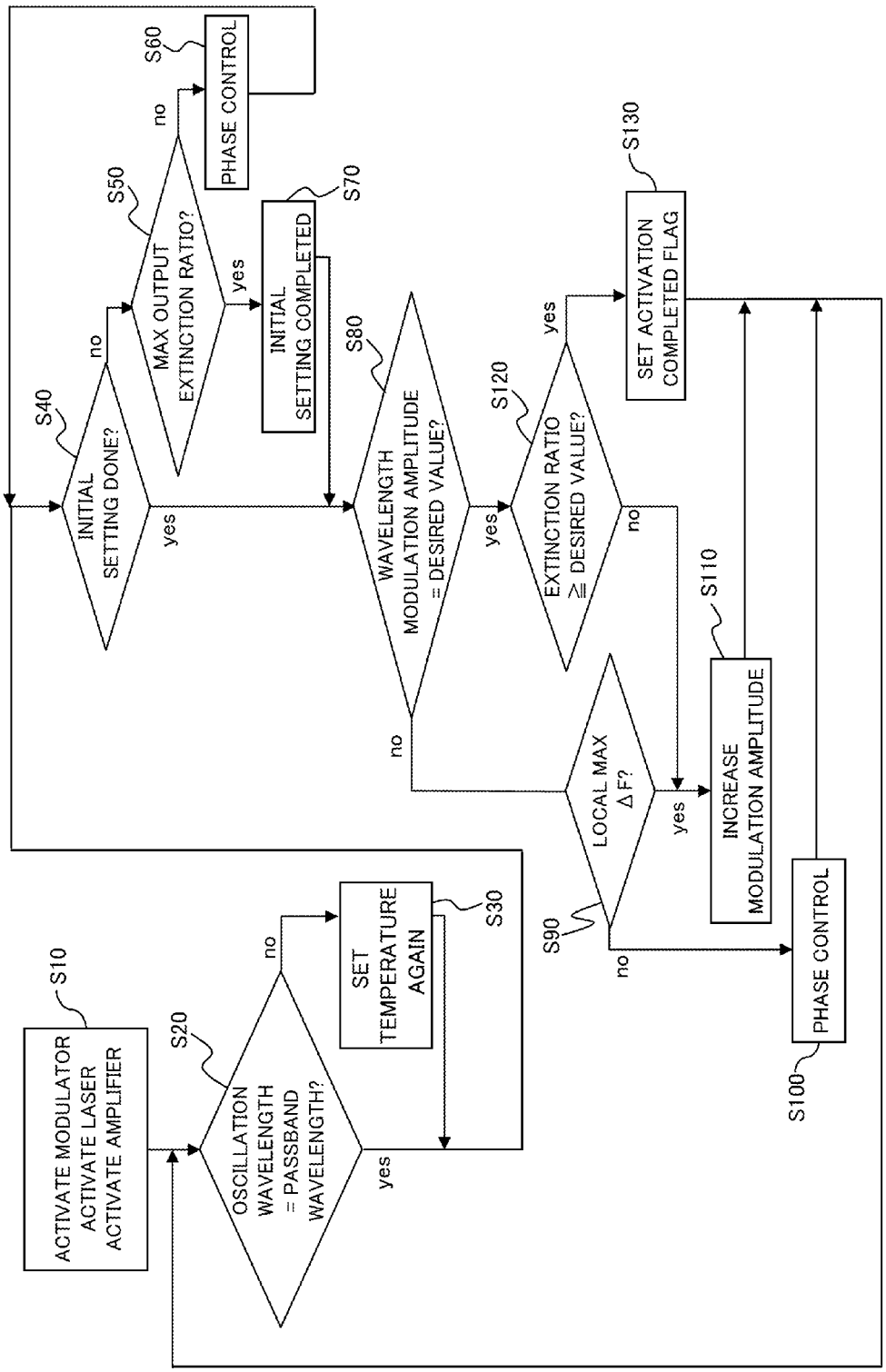
FIG. 6 is a flowchart illustrating a method of controlling the optical signal generator according to the first embodiment.

Specifically, the control circuit 400 performs a control (method of controlling an optical signal generator, driving method), such as the one depicted in the flowchart in FIG. 6.

Firstly, while operating a single-mode laser 110 by supplying a constant current, the control circuit 400 performs a control (first control) to match the oscillation wavelength (oscillation frequency) of the single-mode laser 110 and the operating wavelength (operating frequency) of the wavelength filter 220 (in FIG. 6, Steps S10 to S30).

Here, the control circuit 400 drives (activates) the single-mode laser 110 under a constant current condition, drives (activates) the intensity modulator 140 with an extinction ratio of approximately 1 dB and a bit rate of approximately 10 Gbps, and drives (activates) the optical amplifier 130 (Step S10). The control circuit 400 then controls the temperature of the integrated device 10 (device driving temperature) (Steps S20 and S30). Specifically, the control circuit 400 determines whether the oscillation wavelength (oscillation frequency) of the single-mode laser 110 is equal to the operating wavelength (operating frequency) of the wavelength filter 220 (Step S20). If so (YES route), the control circuit 400 proceeds to a second control (Steps S40 to S70) which will be described later. If not (NO route), the control circuit 400 sets the temperature again, and controls the temperature of the integrated device 10 (Step S30).

Subsequently, while providing intensity modulation by driving the intensity modulator 140 with a rectangular wave electric signal (modulated signal), the control circuit 400 drives the phase adjuster 120, and controls the phase adjuster 120 such that the extinction ratio (output extinction ratio) of the optical signal after passing through the wavelength filter 220 becomes the maximum (second control, Steps S40 to S70). In the present embodiment, the phase is adjusted around $0.7\pi$ in FIG. 4.

By performing this second control, in the region where higher output extinction ratios are obtained (the peaks in the right-hand side in FIG. 4) (in the present embodiment, in a phase shift range (phase shift amount) from about $0.5\pi$ to about $\pi$), a control to attain a desired frequency modulation amplitude and a desired extinction ratio is made available.

This represents adjusting the phase such that the transmittance of output light wavelength through the wavelength filter 220 (filter transmittance) in the signal on state by the intensity modulation by the intensity modulator 140 becomes higher than the filter transmittance of the output light wavelength in the signal off state. In other words, it means adjusting the phase such that the wavelength of the output light varies from wavelengths having higher transmittances to wavelengths having lower transmittances in the transmission characteristic of the wavelength filter 220 when transitioning from the signal on state to the signal off state by the intensity modulation by the intensity modulator 140, whereas the wavelength of the output light varies from wavelengths having lower transmittances to wavelengths having higher transmittances in the transmission characteristic of the wavelength filter 220 when transitioning from the signal off state to the signal on state by the intensity modulation by the intensity modulator 140 (i.e., it means adjusting the phase such that the signal on state and the signal off state obtained by the intensity modulation by the intensity modulator 140 are matched to the signal on state and the signal off state of the light passing through the wavelength filter 220, respectively).

Note that the second control is not limited to the control described above, and the control circuit 400 may control the phase adjuster 120 such that the frequency modulation amplitude has a maximum absolute value with a desired sign. In the present embodiment, the value of the frequency modulation amplitude is the frequency difference obtained by subtracting the frequency in the signal off state from the frequency in the signal on state, and accordingly the desired sign is the plus sign. Thus, the phase is adjusted around 0.7 π, in FIG. 3, in this case.

Specifically, the control circuit 400 determines whether the initial setting has been completed (Step S40). If so (YES route), the control circuit 400 proceeds to a third control (Steps S80 to S110) which will be later. Otherwise, if the initial setting has not been completed (NO route), the control circuit 400 proceeds to Step S50 wherein it is determined whether the extinction ratio (output extinction ratio) of the optical signal after passing through the wavelength filter 220 is the maximum. If determining that the output extinction ratio is the maximum (YES route), the control circuit 400 finishes the initial setting (Step S70), and proceeds to a third control (Step S80 to S110) which will be described later. Otherwise, if determining that the output extinction ratio is not the maximum (NO route), the control circuit 400 adjusts the phase by controlling the phase adjuster 120 (Step S60).

In the present embodiment, an initial setting completed flag is set when the output extinction ratio is determined as being the maximum to assure that the second control is performed during the initial setting (during power on of the apparatus) only, rather than repeatedly performing the second control. The determination as to whether the initial setting has been completed is made based on whether the initial setting completed flag is set.

Subsequently, the control circuit 400 controls the phase adjuster 120 to set the frequency difference to a desired value (e.g., approximately 5 GHz) if the frequency difference (frequency modulation amplitude) is not the desired value (e.g., approximately 5 GHz) and the frequency difference is not the local maximum. Otherwise, the control circuit 400 controls the intensity modulator 140 to increase the extinction ratio if the frequency difference is the local maximum (third control, Steps S80 to S110).

Specifically, the control circuit 400 determines whether the frequency difference is equal to the desired value (e.g., approximately 5 GHz) (Step S80). If it is determined that the frequency difference is not equal to the desired value (e.g., approximately 5 GHz) in the determination (NO route), the control circuit 400 determines whether the frequency difference (Δf) is the local maximum (Step S90).

If the frequency difference is greater than the desired value (e.g., approximately 5 GHz) and the frequency difference is not the local maximum, the control circuit 400 reduces the frequency difference by controlling the phase adjuster 120 and adjusting the phase (Step S100). Otherwise, if the frequency difference is smaller than the desired value (e.g., approximately 5 GHz) and the frequency difference is not the local maximum, the control circuit 400 increases the frequency difference by controlling the phase adjuster 120 and adjusting the phase (Step S100). Otherwise, if the frequency difference is not equal to the desired value (e.g., approximately 5 GHz) and the frequency difference is the local maximum, the control circuit 400 increases the extinction ratio by increasing the amplitude voltage of a modulated signal supplied to the intensity modulator 140 (Step S110).

Herein, the following control is made to determine whether the frequency difference (Δf) is the local maximum.

Figure 7:
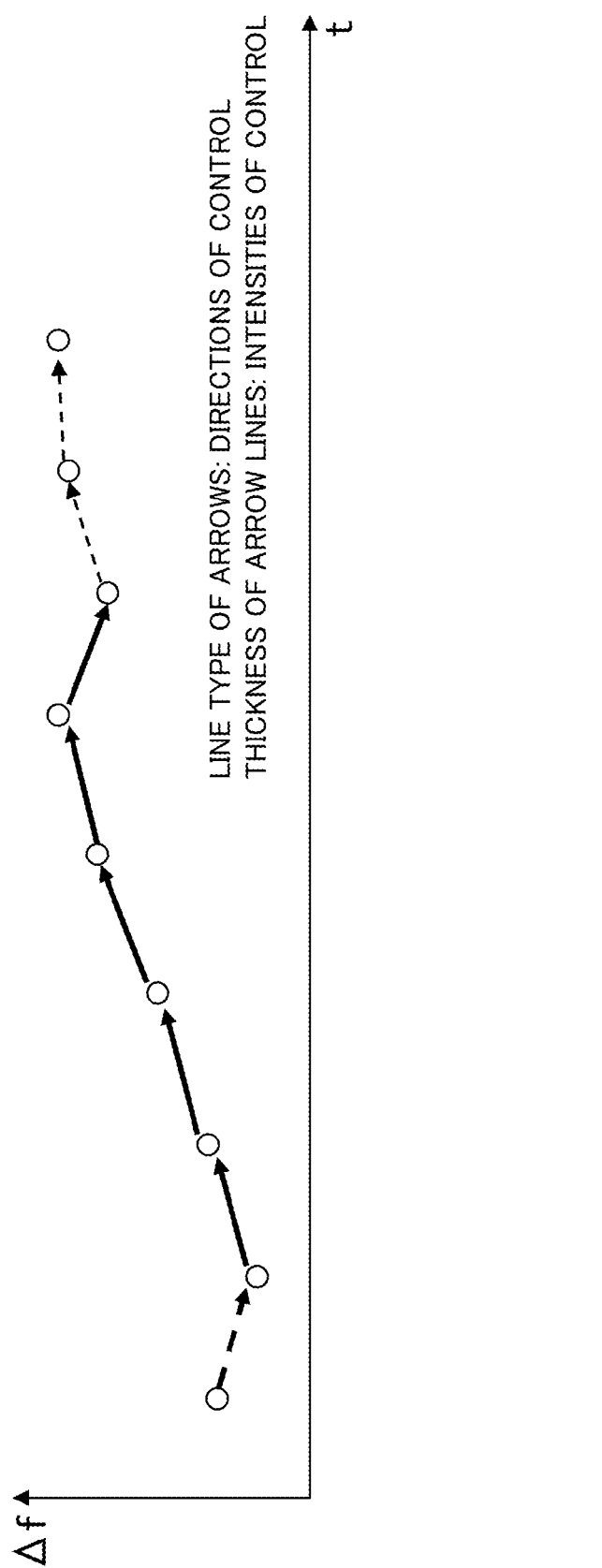
FIG. 7 a diagram illustrating the control upon the local maximum determination in the optical signal generator according to the first embodiment.

More specifically, if Δf has not approached the desired Δf after the phase adjuster 120 is controlled and the phase is adjusted, for example, as depicted in FIG. 7, the control circuit 400 makes the control in the opposite direction. If Δf has approached the desired Δf, the control circuit 400 continues to make the control in the same direction. If the Δf has not approached the desired Δf after making the control twice in the same direction, a control in the opposite direction is made with a reduced intensity of the control, since the local maximum is present somewhere between the two steps.

Figure 8:
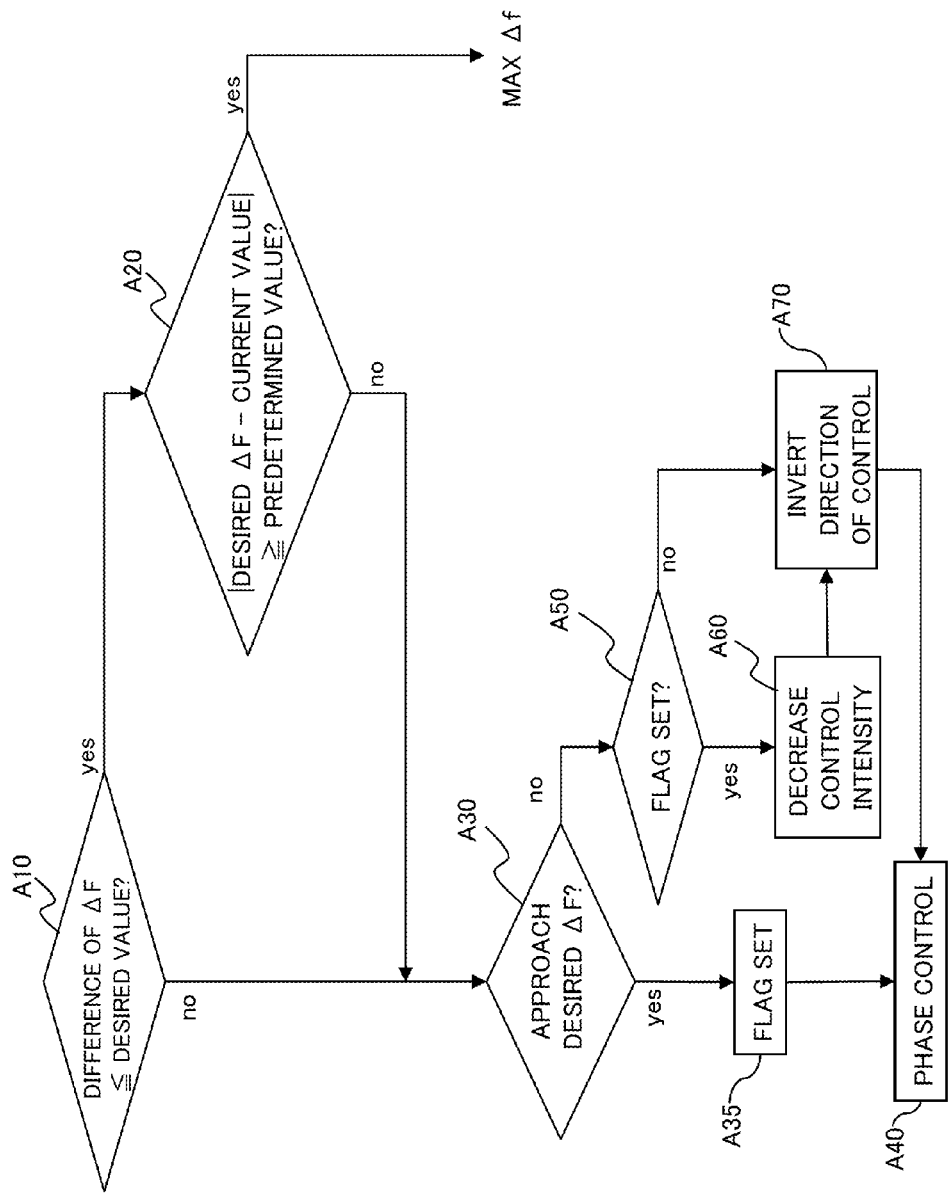
FIG. 8 is a flowchart illustrating a procedure for the local maximum determination in the optical signal generator according to the first embodiment.

Such a control is made in the procedure as depicted in the flowchart in FIG. 8. Note that the processing depicted in the flowchart in FIG. 8 is the processing performed in the Step S90 in FIG. 6.

More specifically, a determination is made as to whether the change (change width; change amount) in Δf is equal to or smaller than a predetermined value (Step A10). If so (YES route), a further determination is made as to whether the absolute value of the difference between the desired Δf and the current Δf is equal to or greater than a predetermined value (Step A20). If it is determined that the absolute value of the difference between the desired Δf and the current Δf is equal to or greater than the predetermined value in the determination (YES route), it is determined that Δf is the local maximum.

Otherwise, if it is determined that the change in Δf is greater than the predetermined value in Step A10 (NO route) or if it is determined that the absolute value of the difference between the desired Δf and the current Δf is smaller than the predetermined value in Step A20 (NO route), a further determination is made as to whether Δf has approached the desired Δf (Step A30).

If it is determined that Δf has approached the desired Δf (YES route), the flag is set (Step A35) and the phase adjuster 120 is controlled and the phase is adjusted (Step A40). Otherwise, if it is determined that Δf has not approached the desired Δf (NO route), a determination is made as to whether the flag is set (Step A50). If the flag is set, the control intensity is reduced (Step A60) and the direction of the control is inversed (Step A70). The phase adjuster 120 is then controlled and the phase is adjusted (Step A40). Otherwise, if it is determined that the flag is not set in Step A50 (NO route), the flow proceeds to Step A70 wherein the direction of the control is inversed (Step A70). The phase adjuster 120 is then controlled and the phase is adjusted (Step A40). Although the step for adjusting the phase (phase control step) is referenced to by Step A40, this step corresponds to Step S100 in FIG. 6.

Subsequently, as depicted in FIG. 6, the control circuit 400 controls the intensity modulator 140 such that the extinction ratio of the optical signal output via the wavelength filter 220 becomes a desired value (e.g., approximately 10 dB) or higher when the frequency difference is equal to the desired value (e.g., approximately 5 GHz) (fourth control, Steps S110 and S120).

Specifically, if determining that the frequency difference is equal to the desired value (e.g., approximately 5 GHz) in Step S80 (YES route), the control circuit 400 proceeds to Step S120 wherein it is determined whether the extinction ratio (output extinction ratio) of the optical signal after passing through the wavelength filter 220 is equal to or greater than a desired value (e.g., approximately 10 dB).

If determining that the output extinction ratio is smaller than the desired value (e.g., approximately 10 dB) (NO route), the control circuit 400 proceeds to Step S110 wherein the amplitude voltage of a modulated signal supplied to the intensity modulator 140 (modulator driving amplitude voltage) is increased. More specifically, if the frequency difference is equal to the desired value (e.g., approximately 5 GHz) and if the extinction ratio of the optical signal after passing through the wavelength filter 220 is smaller than the desired value (e.g., approximately 10 dB), the amplitude voltage (modulator driving amplitude voltage) of the modulated signal supplied to the intensity modulator 140 is increased.

Otherwise, if determining that the output extinction ratio is equal to or greater than the desired value (e.g., approximately 10 dB) (YES route), the control circuit 400 sets an activation completed flag (Step S130), and returns to Step S20 to repeat the above-described first, third, and fourth controls. This results in an optical signal having a frequency difference (frequency modulation amplitude) of the desired value (e.g., approximately 5 GHz) and an output extinction ratio of the desired value (e.g., approximately 10 dB) or greater being output via the wavelength filter 220.

As described above, an optical signal generator and a method for adjusting the same according to the present embodiment, the frequency difference between the signal on state and the signal off state (frequency modulation amplitude) generated by intensity modulation can be adjusted independently from intensity modulation, with a simplified and practical structure exhibiting a smaller dynamic wavelength chirp. Thus, the embodiment is advantageous in that it is possible to suppress distortion of waveforms to increase the transmission distance, in addition to accommodating different modulation bit rates.

In other words, the embodiment is advantageous in that it is possible to set the magnitude of frequency modulation (frequency difference, frequency modulation amplitude) and the magnitude of intensity modulation (extinction ratio) to any suitable values, and in that a reduced dynamic wavelength chirp helps to provide optical signals after passing through a wavelength filter having an increased transmission distance for different modulation bit rates, with a simplified structure.

Second Embodiment

Next, an optical signal generator and a method for adjusting the same according to a second embodiment will be described with reference to FIGS. 9-11.

Figure 9:
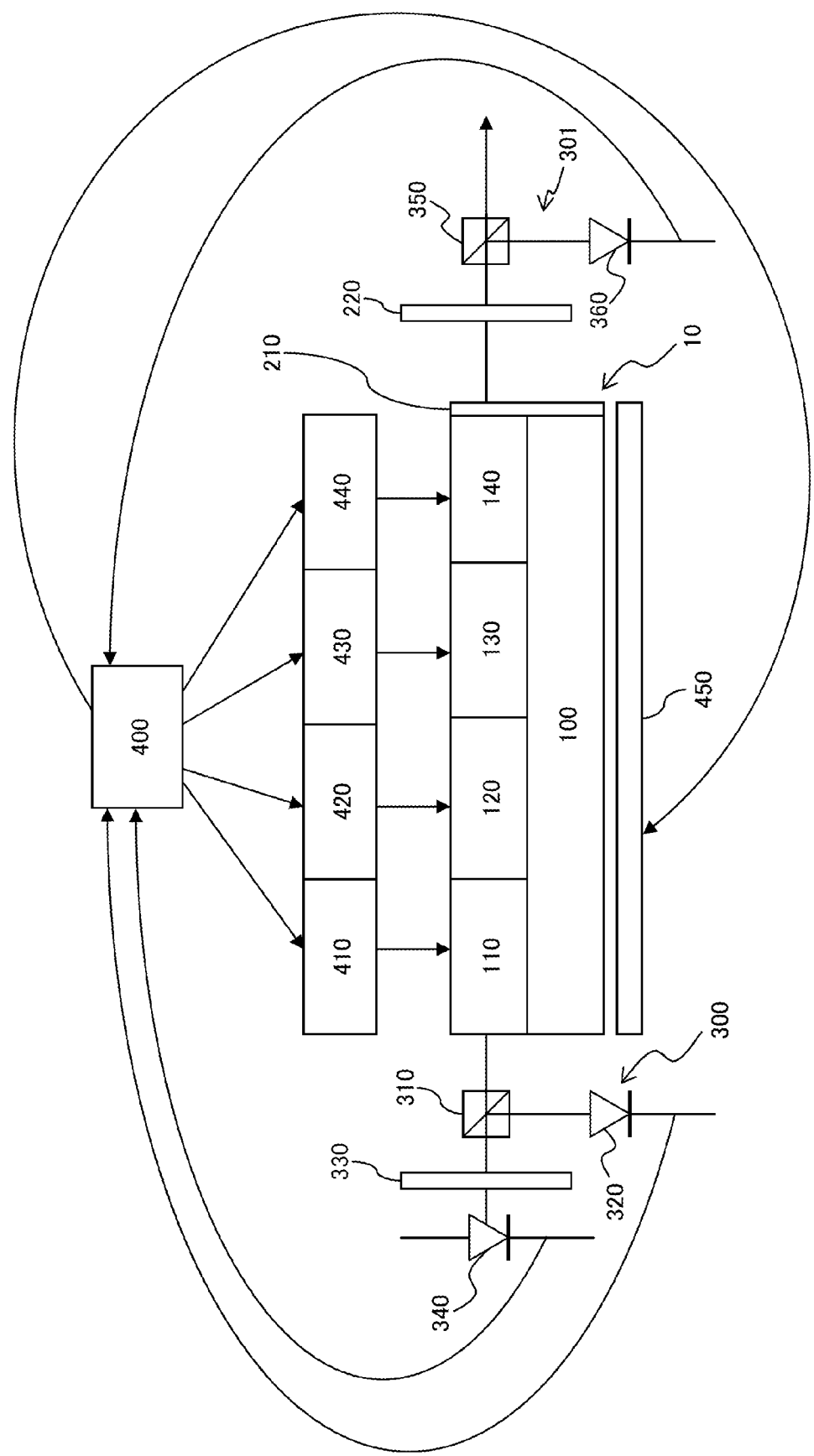
FIG. 9 is a schematic view illustrating a configuration of an optical signal generator according to a second embodiment.

The optical signal generator according to the second embodiment is different from optical signal generator in above-described first embodiment in that driving circuits 410, 420, 430, and 440, and monitor circuits 300 and 301 are provided, as depicted in FIG. 9. In FIG. 9, the same elements as those in the above-described first embodiment (see FIG. 1) are referenced by the like reference symbols.

In addition to the components in the above-described first embodiment, the optical signal generator of the second embodiment includes a first beam splitter 310, a first monitor PD (photo detector, photo diode) 320, a monitoring wavelength filter 330, a second monitor PD (photo detector, photo diode) 340, a second beam splitter 350, a third monitor PD (photo detector, photo diode) 360, a laser drive circuit 410 to drive a single-mode laser 110, a phase adjuster drive circuit 420 to drive the phase adjuster 120, an optical amplifier drive circuit 430 to drive the optical amplifier 130, an intensity modulator drive circuit 440 to drive the intensity modulator 140, and a Peltier controller (Peltier element) 450 to control the temperature of the entire integrated device (entire device) 10, as depicted in FIG. 9.

Here, the first beam splitter 310 is a quartz (silica) plate with a wedge angle formed therein, for example.

The monitoring wavelength filter 330 is a dielectric multi-layer disposed on the emission-side end face of the first beam splitter 310, for example. The monitoring wavelength filter 330 exhibits the transmission characteristic as depicted in FIG. 11, having a portion where the transmittance varies linearly with wavelength. Although a transmission-type filter is used as the monitoring wavelength filter 330 here, a reflection-type filter may also be used.

The second beam splitter 350 may be a quartz (silica) plate, for example.

Here, the first beam splitter 310 is disposed on the side opposite to the signal output side of the integrated device 10 (the side on which the wavelength filter 220 is provided). On the side of one of the outputs of the first beam splitter 310, the first monitor PD 320 is disposed. Furthermore, on the side of the other output of the first beam splitter 310, the monitoring wavelength filter 330 and the second monitor PD 340 are disposed.

A part of the output light split by the first beam splitter 310 is detected by the first monitor PD 320, while the light passing through the monitoring wavelength filter 330 of a part of the output light split by the first beam splitter 310 is detected by the second monitor PD 340. In other words, a part of the output light from the single-mode laser 110 (here, the light output to the side opposite to the signal output side where the wavelength filter 220 is provided) is received by the first monitor PD 320. In addition, a part of the output light from the single-mode laser 110 (here, the light output to the side opposite to the signal output side where the wavelength filter 220 is provide) passes through the monitoring wavelength filter 330, which is received by the second monitor PD 340.

In addition, the second beam splitter 350 is disposed on the output side of the wavelength filter 220 provided on the signal output side of the integrated device 10. On the side where the light split by the second beam splitter 350 is output, the third monitor PD 360 is disposed. A part of the output light split by the second beam splitter 350 is detected by the third monitor PD 360. In other words, a part of optical signals passing through the wavelength filter 220 is received by the third monitor PD 360.

In the present embodiment, the control circuit 400 is configured to control the single-mode laser 110, the phase adjuster 120, the optical amplifier 130, the intensity modulator 140, and the temperature of the integrated device 10 through the respective driving circuits (drive circuits) 410, 420, 430, and 440, based on signals from the first monitor PD 320, the second monitor PD 340, and the third monitor PD 360.

Here, detection signals from the first monitor PD 320, the second monitor PD 340, and the third monitor PD 360 are received by the control circuit 400, control signals from which are sent to the respective driving circuit 410, 420, 430, and 440. Drive signals from the driving circuit 410, 420, 430, and 440 are sent to the single-mode laser 110, the phase adjuster 120, the optical amplifier 130, the intensity modulator 140, and the Peltier controller (wavelength adjusting unit; wavelength adjusting means) 450.

The first control, which has been described as being performed by the control circuit 400 in the above-described first embodiment (i.e., the control to match the oscillation wavelength (oscillation frequency) of the single-mode laser 110 and the operating wavelength (operating frequency) of the wavelength filter 220) is performed by controlling the Peltier controller 450, based on wavelength information obtained from signals from the first monitor PD 320 and the second monitor PD 340. In other words, the control circuit 400 is adapted to match the oscillation wavelength of the single-mode laser 110 with the slope center part the transmission characteristic of the monitoring wavelength filter 330, based on signals from the first monitor PD 320 and the second monitor PD 340, as depicted in FIG. 11. This results in the oscillation wavelength (oscillation frequency) of the single-mode laser 110 and the operating wavelength (operating frequency) of the wavelength filter 220 being matched.

The second control, which has been described as being performed by the control circuit 400 in the above-described first embodiment (i.e., the control to set the output extinction ratio of the optical signal after passing through the wavelength filter 220 to the maximum) is performed by controlling the phase adjuster 120, based on a signal from the third monitor PD 360.

The third control, which has been described as being performed by the control circuit 400 in the above-described first embodiment (i.e., the control to set the frequency difference to a desired value (e.g., approximately 5 GHz) if the frequency difference (frequency modulation amplitude) is not the desired value (e.g., approximately 5 GHz) and the frequency difference is not the local maximum, whereas to increase the extinction ratio if the frequency difference is the local maximum) is performed by controlling the phase adjuster 120 or the intensity modulator 140, based on signals from the first monitor PD 320 and the second monitor PD 340.

The fourth control, which has been described as being performed by the control circuit 400 in the above-described first embodiment (i.e., the control to set the extinction ratio of the optical signal output via the wavelength filter 220 to a desired value (e.g., approximately 10 dB) or higher if the frequency difference is equal to the desired value (e.g., approximately 5 GHz)) is performed by controlling the intensity modulator 140, based on a signal from the third monitor PD 360.

Figure 10:
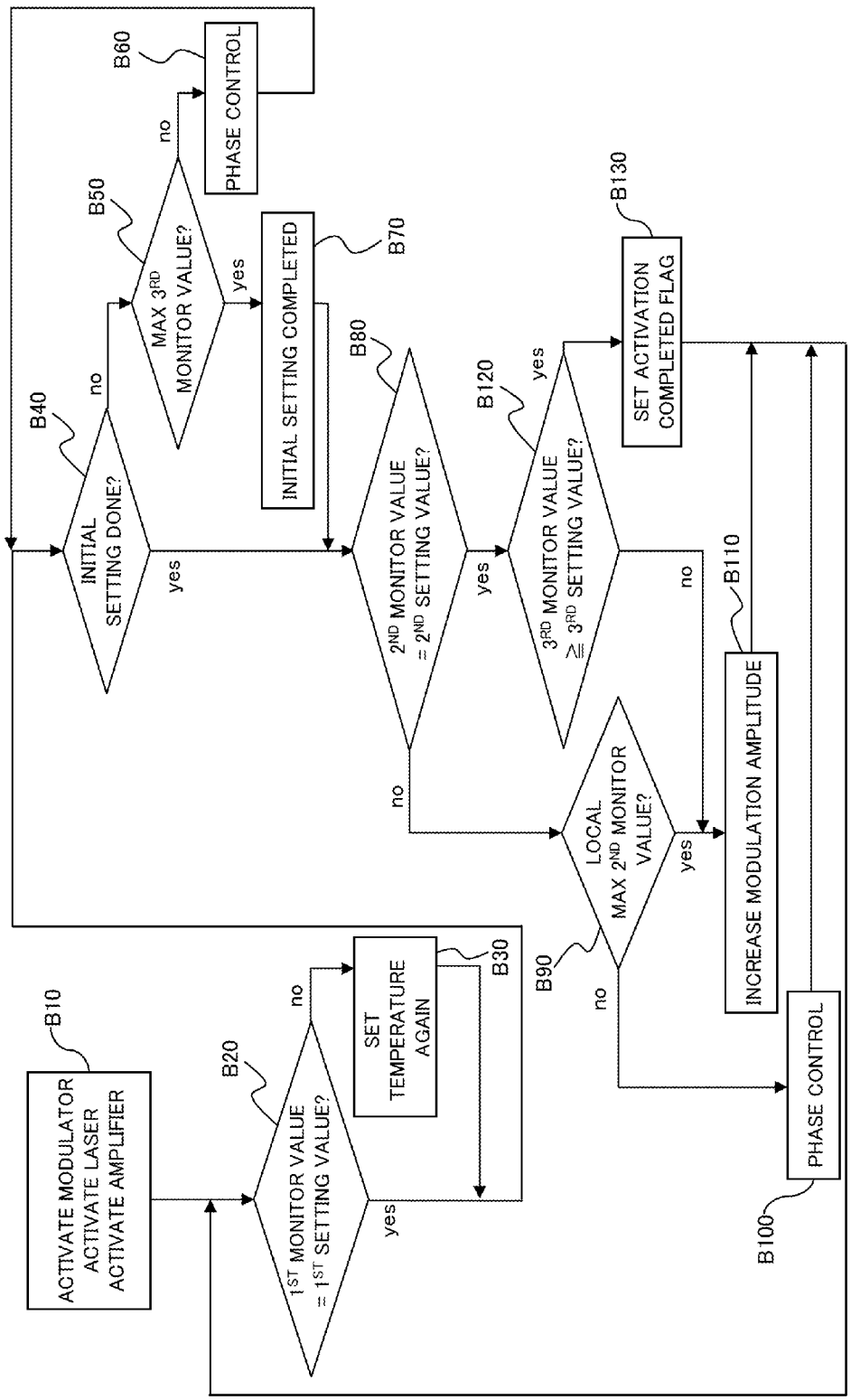
FIG. 10 is a flowchart illustrating a method of controlling the optical signal generator according to the second embodiment.
Figure 11:
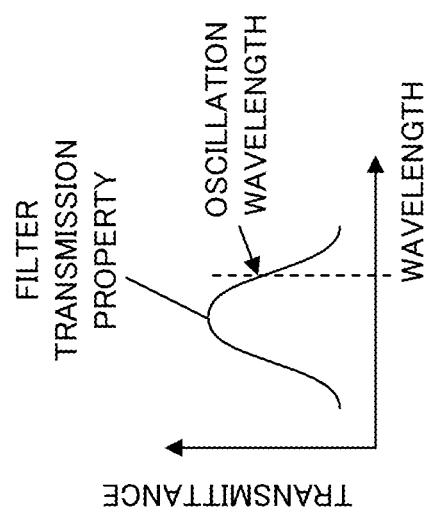
FIG. 11 is a diagram illustrating the transmission characteristic of a monitoring wavelength filter provided in the optical signal generator according to the second embodiment, as well as illustrating the control to match the oscillation wavelength of the single-mode laser with the operating wavelength of the monitoring wavelength filter.

Specifically, the control circuit 400 performs a control (method of controlling an optical signal generator, driving method), such as the one depicted in the flowchart in FIG. 10.

Firstly, while operating a single-mode laser 110 by supplying a constant current, the control circuit 400 performs a control (first control) to match the oscillation wavelength (oscillation frequency) of the single-mode laser 110 and the operating wavelength (operating frequency) of the wavelength filter 220 (in FIG. 10, Steps B10 to B30).

In this embodiment, the control circuit 400 drives (activates) the single-mode laser 110 under a constant current condition, drives (activates) the intensity modulator 140 with an extinction ratio of approximately 1 dB and a bit rate of approximately 10 Gbps, and drives (activates) the optical amplifier 130 (Step B10). The control circuit 400 then determines whether the ratio of the signal from the second monitor PD 340 (direct current component, average frequency) to the signal from the first monitor PD 320 (direct current component, average frequency) (signal from the second monitor PD 340 (direct current component)/signal from the first monitor PD 320 (direct current component)) (first monitor value) is equal to a first setting value (Step B20). Note that the first setting value is a first monitor value when the oscillation wavelength of the single-mode laser 110 and the operating wavelength of the wavelength filter 220 are matched.

If not (NO route), the control circuit 400 sets the temperature again, and controls the temperature of the integrated device 10 (device driving temperature) by controlling the Peltier controller 450 (Step B30). If so (YES route), the control circuit 400 proceeds to a second control (Steps B40 to B70) which will be described later.

Subsequently, the control circuit 400 controls the phase adjuster 120 such that the output extinction ratio of the optical signal after passing through the wavelength filter 220 becomes the maximum (second control, Steps B40 to B70).

In the present embodiment, the control circuit 400 determines whether the initial setting has been completed (Step B40). If not (NO route), the control circuit 400 proceeds to Step B50 in which a determination is made as to whether a ratio of a signal from the third monitor PD 360 (alternating current component, intensity variation range) to a signal from the third monitor PD 360 (direct current component, average intensity) (signal from the third monitor PD 360 (alternating current component)/signal from the third monitor PD (direct current component)) (third monitor value, normalized output extinction ratio) is the maximum. If it is determined that the ratio is not the maximum (NO route), the control circuit 400 controls the phase adjuster 120 to adjust the phase (Step B60). If the ratio is the maximum (YES route), the control circuit 400 terminates the initial setting (Step B70), and proceeds to a third control (Steps B80 to B110) which will be described later.

Subsequently, the control circuit 400 controls the phase adjuster 120 such that the frequency difference becomes the desired value (e.g., approximately 5 GHz) if the frequency difference (frequency modulation amplitude) is not a desired value (e.g., approximately 5 GHz) and the frequency difference is not the local maximum, while controlling the intensity modulator 140 to increase the extinction ratio if the frequency difference is the local maximum (third control, Steps B80 to B110).

In the present embodiment, the control circuit 400 determines whether the ratio of the signal from the second monitor PD 340 (alternating current component, frequency variation range) to the signal from the first monitor PD 320 (direct current component, average frequency) (signal from the second monitor PD 340 (alternating current component)/signal from the first monitor PD 320 (direct current component)) (second monitor value, normalized value of the frequency modulation amplitude) is equal to a second setting value (Step B80). Note that the second setting value is a second monitor value when the frequency modulation amplitude is equal to the desired value (e.g., approximately 5 GHz).

If it is determined that the second monitor value is not equal to the second setting value in the determination (NO route), the control circuit 400 determines whether the second monitor value is the local maximum (Step B90). If the second monitor value is not equal to the second setting value and the second monitor value is not the local maximum (NO route), the phase adjuster 120 is controlled to adjust the phase, thereby adjusting the frequency modulation amplitude (Step B100). If the second monitor value is not equal to the second setting value and the second monitor value is the local maximum (YES route), a control is made to increase the amplitude of a modulated signal supplied to the intensity modulator 140 to increase the extinction ratio (Step B110).

Subsequently, the control circuit 400 controls the intensity modulator 140 such that the extinction ratio of the optical signal output via the wavelength filter 220 becomes a desired value (e.g., approximately 10 dB) or higher if the frequency difference is equal to the desired value (e.g., approximately 5 GHz) (fourth control, Steps B110 and B120).

In the present embodiment, if it is determined that the second monitor value is equal to the second setting value in Step B80 (YES route), the flow proceeds to B120 in which a determination is made as to whether a ratio of a signal from the third monitor PD 360 (alternating current component) to a signal from the third monitor PD 360 (direct current component) (signal from the third monitor PD 360 (alternating current component)/signal from the third monitor PD 360 (direct current component)) (third monitor value) is equal to or greater than a third setting value. Note that the third setting value is a third monitor value when the output extinction ratio is equal to a desired value (e.g., approximately 10 dB).

If it is determined that the third monitor value is smaller than the third setting value in the determination (NO route), the flow proceeds to Step B110 in which a control is made to increase the amplitude voltage (modulator driving amplitude voltage) of a modulated signal supplied to the intensity modulator 140 to increase the extinction ratio (output extinction ratio) of the optical signal after passing through the wavelength filter 220.

Otherwise, if it is determined that the third monitor value is equal to or greater than the third setting value (YES route), the control circuit 400 sets an activation completed flag (Step B130), and returns to Step B20 to repeat the above-described first, third, and fourth controls. This results in an optical signal having a frequency difference (frequency modulation amplitude) of the desired value (e.g., approximately 5 GHz) and an output extinction ratio of the desired value (e.g., approximately 10 dB) or greater being output via the wavelength filter 220.

The description of other details is omitted since they are the same as those in the above-described first embodiment and variants thereof.

As described above, an optical signal generator and a method for adjusting the same according to the present embodiment, similar to the above-described first embodiment, the frequency difference between the signal on state and the signal off state (frequency modulation amplitude) generated by intensity modulation can be adjusted independently from intensity modulation, with a simplified and practical structure exhibiting a smaller dynamic wavelength chirp. Thus, the embodiment is advantageous in that it is possible to suppress distortion of waveforms to increase the transmission distance, in addition to accommodating different modulation bit rates.

In other words, the embodiment is advantageous in that it is possible to set the magnitude of frequency modulation (frequency difference, frequency modulation amplitude) and the magnitude of intensity modulation (extinction ratio) to any suitable values, and in that a reduced dynamic wavelength chirp helps to provide optical signals after passing through a wavelength filter having an increased transmission distance for different modulation bit rates, with a simplified structure.

Third Embodiment

Next, an optical signal generator and a method for adjusting the same according to a third embodiment will be described with reference to FIGS. 12-16.

Figure 16:
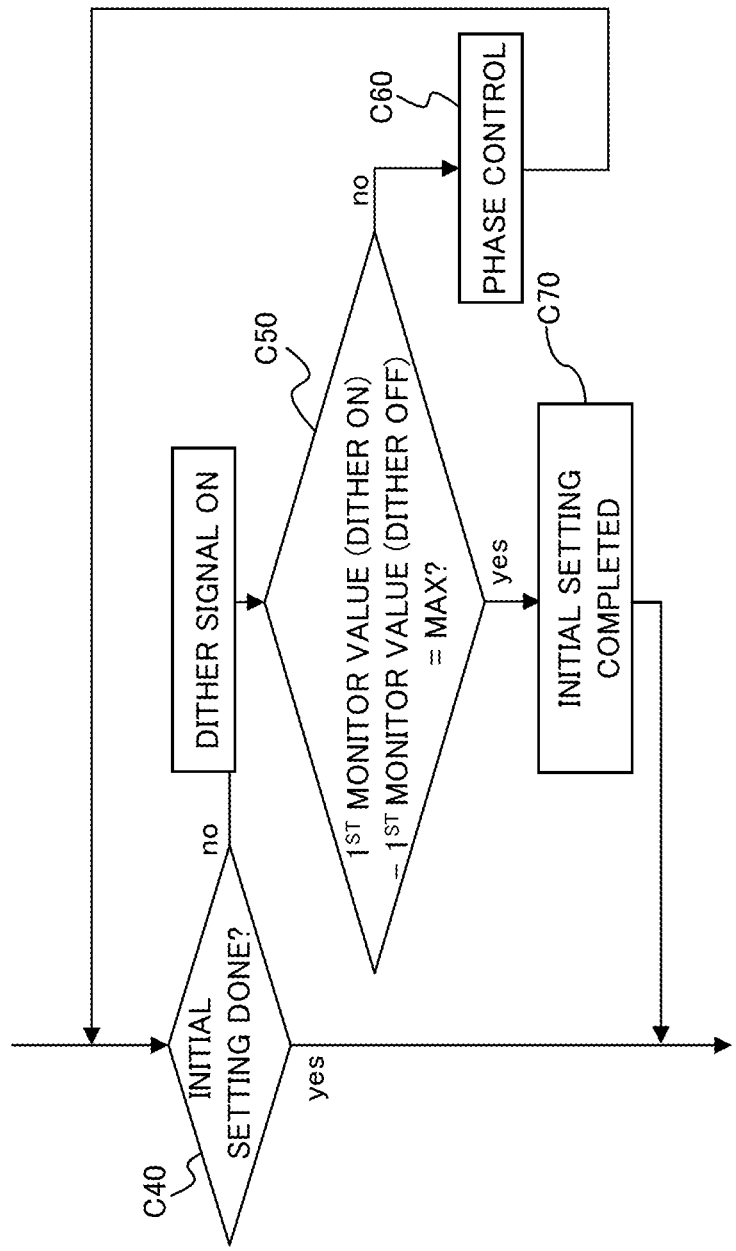
FIG. 16 is a flowchart illustrating a method of controlling the optical signal generator according to the third embodiment.

The optical signal generator according to the present embodiment is different from the above-described second embodiment in that the second control in the above-described second embodiment (control to set the output extinction ratio of an optical signal output via the wavelength filter 220 to the maximum) is made based on a dither signal (see FIG. 16).

Figure 12:
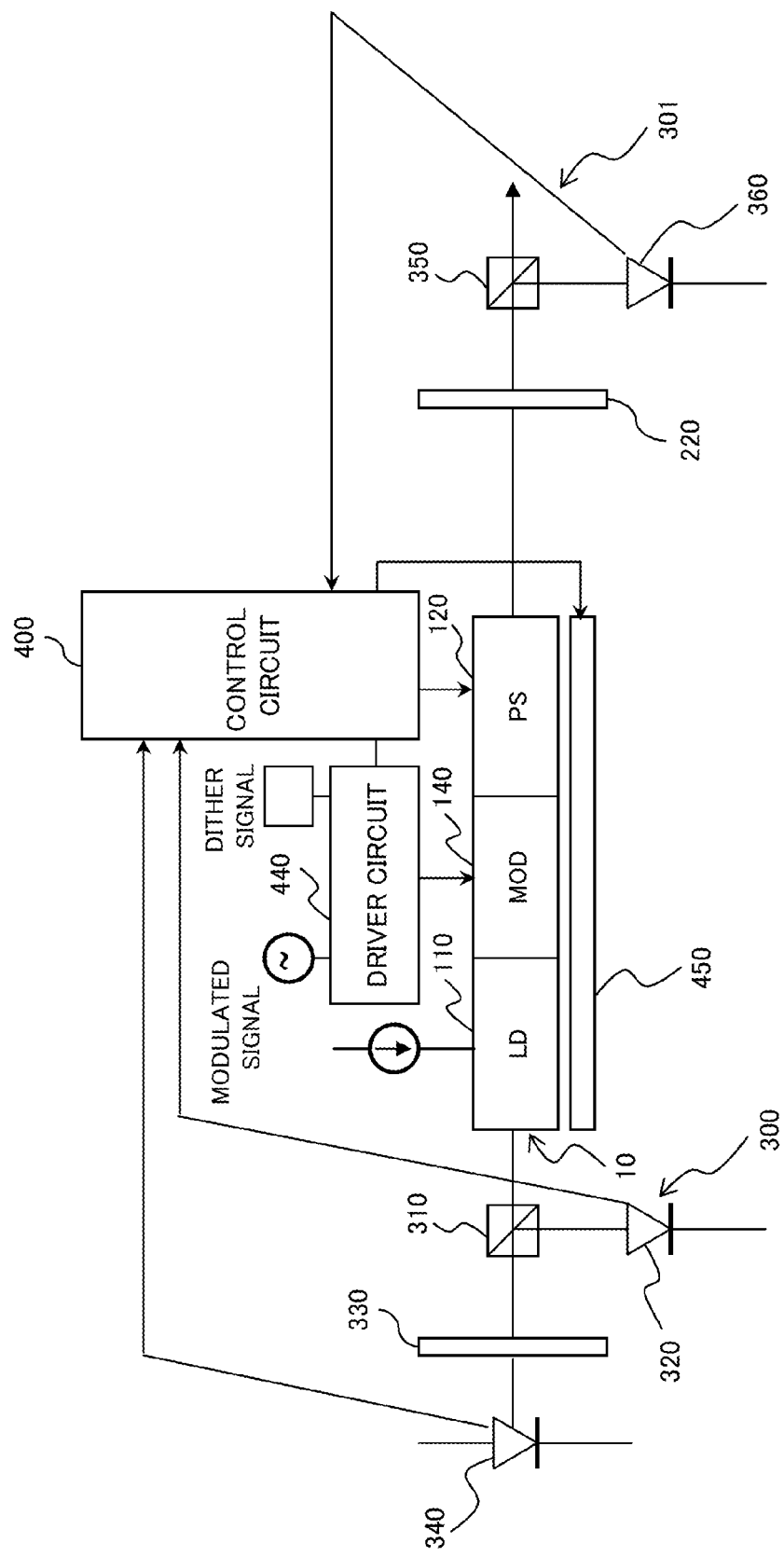
FIG. 12 is a schematic view illustrating a configuration of an optical signal generator according to a third embodiment.

In the present embodiment, as depicted in FIG. 12, a control circuit 400 is configured to supply, to the intensity modulator 140, a dither signal having a frequency sufficiently lower than the bit rate of a modulated signal, and to control the phase adjuster 120 such that the output extinction ratio of light (optical signal) output via the wavelength filter 220 becomes the maximum, based on the dither signal. The same elements in FIG. 12 as those in the above-described second embodiment (see FIG. 9) are referenced by the like reference symbols.

Figure 15:
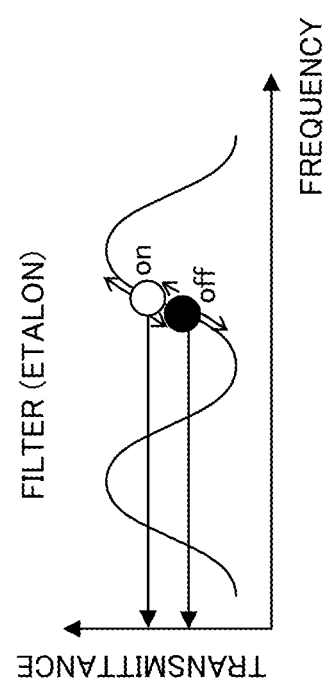
FIG. 15 is a diagram illustrating the transmission characteristic of a monitoring wavelength filter provided in the optical signal generator according to the third embodiment, as well the second control using the same.

Note that, in the present embodiment, an integrated device 10 includes no optical amplifier 130, and the position of a phase adjuster 120 and an intensity modulator 140 are modified. For the sake of simplicity of illustration, a substrate 100, a reflecting mirror 210, and driving circuits 410 and 420 are omitted. An etalon filter exhibiting the transmission characteristic as depicted in FIG. 15 is used as a monitoring wavelength filter 330.

Figure 13:
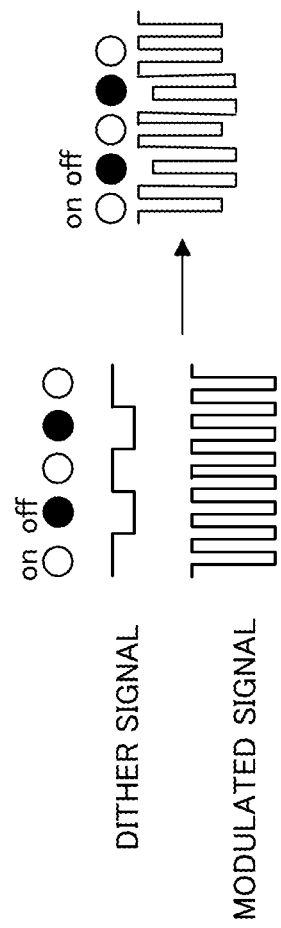
FIG. 13 a diagram illustrating a modulated signal having a dither signal superimposed thereon in the optical signal generator according to the third embodiment.

When the control circuit 400 drives the intensity modulator 140 through a drive circuit 440, the drive circuit 440 is adapted to supply, to the intensity modulator 140, a modulated signal having a low-frequency dither signal superimposed thereon, based on a control signal from the control circuit 400, as depicted in FIG. 13. Here, the dither signal has a frequency of approximately 5 kHz.

Although the dither signal has a frequency of approximately 5 kHz in this example, this is not limiting and the frequency can be increased or decreased. The dither signal preferably has a frequency lower than the cutoff frequency used when separating the output from the first and second monitors PD 320 and 340 into direct and alternating current components.

The control circuit 400 is also configured to perform a control to stop the supply of the dither signal to the intensity modulator 140 after the control on the phase adjuster 120 based on the dither signal is terminated.

The reason why the present embodiment performs the second control in the above-described second embodiment, based on a dither signal is as follows.

The reflectivity becomes a higher state/lower state by on/off of a modulated signal, and the return light quantity to the single-mode laser 110 is modulated. Similarly, the reflectivity becomes a higher state/lower state by on/off of a dither signal, and the return light quantity to the single-mode laser 110 is modulated.

Figure 14:
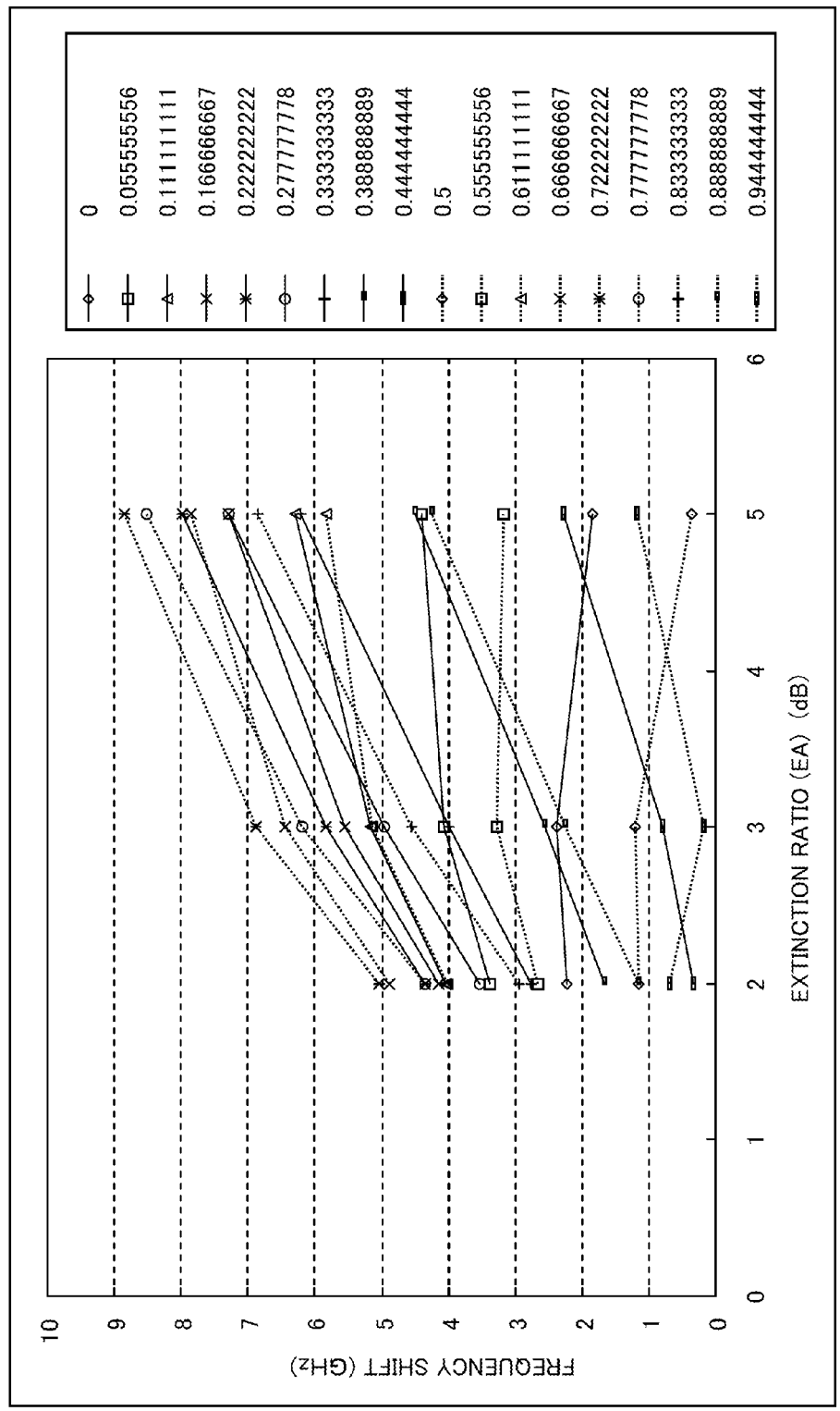
FIG. 14 is a diagram illustrating that a second control can be made using a dither signal in the optical signal generator according to the third embodiment.

In this case, if the frequency shift (frequency difference obtained by subtracting the frequency in the signal off state from the frequency in the signal on state) is large, the frequency shift monotonously increases with respect to the extinction ratio, as depicted in FIG. 14, for example.

In FIG. 14, the frequency shift at an extinction ratio of approximately 2 dB can be regarded as the frequency shift (frequency difference obtained by subtracting the frequency in the signal off state from the frequency in the signal on state) when a dither signal is applied for each phase. In contrast, in FIG. 14, the frequency shift of at an extinction ratio of approximately 5 dB can be regarded as the frequency shift (frequency difference obtained by subtracting the frequency in the signal off state from the frequency in the signal on state) when a modulated signal is applied for each phase.

As depicted in FIG. 14, the frequency shifts when a dither signal is applied and the frequency shifts when a modulated signal is applied show the similar trends with respect to the phase. In other words, when the phase is varied, the absolute value of the frequency difference obtained by subtracting the frequency in the signal off state from the frequency in the signal on state of a dither signal and the absolute value of the frequency difference obtained by subtracting the frequency in the signal off state from the frequency in the signal on state of a modulated signal vary in the similar manner, with the same sign.

In addition, if the frequency difference obtained by subtracting the frequency in the signal off state from the frequency in the signal on state of a modulated signal has a desired sign and its absolute value is the maximum, the output extinction ratio of an optical signal output via the wavelength filter 220 is also the maximum. Thus, if the frequency difference obtained by subtracting the frequency in the signal off state from the frequency in the signal on state of a dither signal has a desired sign and its absolute value is the maximum, the output extinction ratio of an optical signal output via the wavelength filter 220 is the maximum.

Accordingly, in the present embodiment, the determination as to whether the output extinction ratio is the maximum in the second control in the above-described second embodiment (control to set the output extinction ratio of an optical signal output via the wavelength filter 220 to the maximum) is made by determining whether the frequency difference obtained by subtracting the frequency in the signal off state from the frequency in the signal on state of a dither signal has a desired sign and its absolute value is the maximum.

Specifically, the control circuit 400 makes a control, such as the one depicted in the flowchart in FIG. 16, as the second control in the above-described second embodiment.

In the present embodiment, the control circuit 400 determines whether the initial setting has been completed (Step C40).

If it is determined that the initial setting has been completed (YES route), the flow proceeds to the third control, skipping the second control. Otherwise, if no initial setting has been completed (NO route), the flow proceeds to Step C50 in which a first monitor value when a dither signal is the signal on state (signal from the second monitor PD 340 (direct current component)/signal from the first monitor PD 320 (direct current component)) and a second monitor value when dither signal is the signal off state (signal from the second monitor PD 340 (direct current component)/signal from the first monitor PD 320 (direct current component)) are monitored, and it is determined that the difference between the monitored values (the first monitor value when a dither signal is the signal on state—second monitor value when dither signal is the signal off state) has a desired sign (here, plus sign) and its absolute value is the maximum.

In the present embodiment, as depicted in FIG. 15, the transmittances of the monitoring wavelength filter 330 are different when a dither signal is the signal on state and when dither signal is the signal off state. Thus, using the signal (direct current component) detected by the first monitor PD 320 and the second monitor PD 340, it is possible to monitor the frequency when a dither signal is the signal on state (here, the average frequency (center frequency) of the frequency when a modulated signal is the signal on state and the frequency when modulated signal is the signal off state) and the frequency when dither signal is the signal off state (here, the average frequency (center frequency) of the frequency when a modulated signal is the signal on state and the frequency when modulated signal is the signal off state).

If it is determined that the absolute value of the difference is not the maximum in the determination (NO route), the phase adjuster 120 is driven to adjust the phase (Step C60). If the absolute value of the difference is the maximum (YES route), the initial setting is terminated (Step C70) and the flow proceeds to the third control. In other words, this sequence is terminated once the maximum value is achieved.

In this manner, the supply of the dither signal to the intensity modulator 140 is stopped when the second control is terminated.

Although the supply of the dither signal is stopped upon completion of the second control in this embodiment, this is not limited and the supply of the dither signal may be or may not be stopped even after the second control is completed. Since the dither signal may be a noise to the optical signal, the supply of the dither signal is preferably stopped after completion of the second control.

The description of other structures and the method of control are omitted since they are the same as those in the above-described second embodiment and variants thereof.

As described above, according to the present embodiment an optical signal generator and a method for adjusting the same, similar to the above-described second embodiment, the frequency difference between the signal on state and the signal off state (frequency modulation amplitude) generated by intensity modulation can be adjusted independently from intensity modulation, with a simplified and practical structure exhibiting a smaller dynamic wavelength chirp. Thus, the embodiment is advantageous in that it is possible to suppress distortion of waveforms to increase the transmission distance, in addition to accommodating different modulation bit rates.

In other words, the embodiment is advantageous in that it is possible to set the magnitude of frequency modulation (frequency difference, frequency modulation amplitude) and the magnitude of intensity modulation (extinction ratio) to any suitable values, and in that a reduced dynamic wavelength chirp helps to provide optical signals after passing through a wavelength filter having an increased transmission distance for different modulation bit rates, with a simplified structure.

Others

Note that the present disclosure is not restricted to the embodiments described above and their variants, and various modifications may be made without departing from the spirit of the present disclosure.

For example, although an n-type InP substrate is used as the semiconductor substrate 100 in the above-described embodiments, this is not limiting. For example, other semiconductor substrates, such as GaAs substrates, or p-type semiconductor substrates may be used and the same effects may be obtained from other substrates. A p-type semiconductor substrate is preferred, however, when an integrated device is constructed as described in the above-described embodiments, since an higher resistance of p-type regions can be exploited for electric isolation between functional regions.

Furthermore, although the above-described embodiments have been described in the context in which the single-mode laser 110 is a DFB laser and a device temperature control is used for controlling the wavelength of that laser, this is not limiting. For example, the single-mode laser 110 may be a DBR laser or a tunable laser. If a tunable laser is used as a single-mode laser, a wavelength control mechanism of the tunable laser can be used for controlling the wavelength, instead of controlling the temperature. A tunable laser may be an integrated tunable laser (semiconductor integrated tunable laser), such as a TDA-DFB laser and an SG-DBR laser, or an external cavity laser. Note that an integrated tunable laser is preferred for the reason of the size reduction.

Furthermore, although the phase adjuster 120, the optical amplifier 130, and the intensity modulator 140 are disposed, in this order, on the output side of the single-mode laser in the above-described embodiments, this is not limiting and a different order may be used. The similar effects are obtained from different arrangements. When semiconductor optical amplifier is disposed downstream of the intensity modulator, however, some attentions need to be paid, such as restraining the intensity of the light in order to prevent the pattern effect of the semiconductor optical amplifier, or increasing the drive current of the semiconductor optical amplifier. Furthermore, an optical amplifier may be omitted, for example. Note that the optical output and the efficiency may be reduced if a tunable laser is used for the single-mode laser 110, for example. The exemplary gain of the optical amplifier 130 of approximately 5 dB may be changed and similar effect can be achieved from gains other than approximately 5 dB.

Although an electroabsorption modulator is used for the intensity modulator 140 in the above-described embodiments, this is not limiting. For example, other modulator structures, such as a Mach-Zehnder modulator, may be used. Note that the return time to the laser is increased in a longer modulator, such as a Mach-Zehnder modulator, which may restrict the operation bit rate of frequency modulation.

Furthermore, although dielectric multilayer on a device end face is used for the reflecting mirror 210 in the above-described embodiments, this is not limiting. For example, a bulk reflecting mirror may be used. Note that the size of the device becomes large and the return time to the laser is increased in such a case, which may restrict the operation bit rate of frequency modulation.

Furthermore, although the band pass filter 220 is a dielectric multilayer and has a transmission characteristic as depicted in FIGS. 5A and 5B in the above-described embodiments, this is not limiting. Any filters having a transmission characteristic wherein the transmittance sharply changes with respect to frequency, and any filters made of a diffraction grating may be used, for example. Filters having a periodical transmission characteristic, such as an etalon, may be used. In such a case, combining with tunable laser enables operations at multiple wavelengths.

Although the single-mode laser 110, the phase adjuster 120, the optical amplifier 130, and the intensity modulator 140 are all provided over a single substrate in the above-described embodiments, this is not limiting, as long as two or more of the single-mode laser, the phase adjuster, the optical amplifier, and the intensity modulator are provided over the single substrate. In other words, some or all of the single-mode laser, the phase adjuster, the optical amplifier, and the intensity modulator may be formed separate device(s). In the case of separate devices, however, an increased distance between the output end of the laser 110 and the reflecting mirror 210 lengthens the time until the light returns, which restricts the operation bit rate of frequency modulation. In addition, although the present embodiments are provided with an optical amplifier, this is not limiting. For example, the optical amplifier can be omitted. In such a case, two or more of the single-mode laser, the phase adjuster, and the intensity modulator are required to be provided over the single substrate.

Furthermore, although the above-described embodiments have been described in the context in which the control is continued even after the activation completed flag is set, this is not limiting and the control may be switched to a constant control. In such a case, however, the change in state due to deterioration over time of the device must be sufficiently small.

Although the first monitor PD 320, the second monitor PD 340, and the third monitor PD 360 are provided separately to the integrated device 10 in the above-described second and third embodiments, this is not limiting. For example, the first monitor PD 320, the second monitor PD 340, and the third monitor PD 360 may be integrated over the substrate (semiconductor substrate) 100. In other words, at least one of the first monitor PD 320, the second monitor PD 340, and the third monitor PD 360 may be provided over the substrate (semiconductor substrate) 100 over which the single-mode laser 110, the phase adjuster 120, and the intensity modulator 140 are provided. In addition, although the above-described third embodiment is provided with the third monitor PD 360, the third monitor PD 360 may be omitted when only the frequency modulation amplitude is adjusted. In such a case, at least one of the first monitor PD 320 and the second monitor PD 340 is provided over the substrate (semiconductor substrate) 100 over which the single-mode laser 110, the phase adjuster 120, and the intensity modulator 140 are provided.

Furthermore, although the temperature of the integrated device 10 is controlled to match the wavelength (the oscillation wavelength of the single-mode laser 110) of an optical signal output from the integrated device 10 and the operating wavelength (transmission wavelength) of the wavelength filter 220 in the above-described embodiments, this is not limiting. The transmission wavelength of the wavelength filter 220 may be matched to the wavelength of the optical signal by controlling temperature and so forth. In such a case, however, the wavelength of the optical signal may not be compatible with channels for wavelength-multiplexed communications.

Furthermore, although the first beam splitter 310 is a quartz plate with a wedge angle formed therein in the above-described embodiments, this is not limiting. Other beam splitters may be used and may provide the similar effects.

Furthermore, although the monitoring wavelength filter 330 is a dielectric multilayer having a linear transmission spectrum in the above-described embodiments, this is not limiting and the filter may be an etalon, for example. In such a case, using a filter having a periodical transmission characteristic, such as an etalon, as wavelength filter 220, and combining with tunable laser enables operations at multiple wavelengths.

Furthermore, although the first beam splitter 310, the first monitor PD 320, the monitoring wavelength filter 330, and the second monitor PD 340 are disposed on the output side opposite to the signal output side of the single-mode laser 110 in the above-described embodiments, this is not limiting.

For example, a third beam splitter may be interposed between the single-mode laser 110 and the phase adjuster 120, and the first monitor PD 310; or the monitoring wavelength filter 330 and the second monitor PD 340; or the first beam splitter 310, the first monitor PD 320, the monitoring wavelength filter 330, and the second monitor PD 340, may be disposed where light split by the third beam splitter is output.

In such a case, the first monitor PD 310; or the monitoring wavelength filter 330 and the second monitor PD 340; or the first beam splitter 310, the first monitor PD 320, the monitoring wavelength filter 330, and the second monitor PD 340, disposed where light split by the third beam splitter is output, may be integrated over the semiconductor substrate 100, including the third beam splitter, or a part or all of them may be formed as separate device(s). If a part or all of them is/are formed as separate device(s), however, an increased distance between the single-mode laser 110 and the reflecting mirror 210 lengthens the time until the light returns to the single-mode laser 110, which restricts the operation bit rate of frequency modulation. Thus, at least the third beam splitter is preferably integrated above the semiconductor substrate 100.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:
1. An optical signal generator comprising:
a single-mode laser;
a reflecting mirror to define another cavity different from a cavity of the single-mode laser, and reflect a part of output light from the single-mode laser to return the part of the output light to the single-mode laser;
an intensity modulator provided between the single-mode laser and the reflecting mirror; and
a phase adjuster, provided between the single-mode laser and the reflecting mirror, to adjust a frequency difference between a signal on state and a signal off state generated in accordance with intensity modulation by the intensity modulator.

2. The optical signal generator according to claim 1, further comprising a wavelength filter, provided where light passing through the reflecting mirror enters, to convert frequency modulation generated in accordance with the intensity modulation by the intensity modulator to intensity modulation.

3. The optical signal generator according to claim 1, further comprising an optical amplifier provided between the single-mode laser and the reflecting mirror.

4. The optical signal generator according to claim 1, wherein the single-mode laser is a distributed feedback laser or a tunable laser.

5. The optical signal generator according to claim 1, wherein the intensity modulator is an electroabsorption modulator.

6. The optical signal generator according to claim 1, wherein two or more of the single-mode laser, the phase adjuster, and the intensity modulator is provided over a single substrate.

7. The optical signal generator according to claim 1, further comprising:
a first monitor photo detector to receive apart of the output light from the single-mode laser;
a monitoring wavelength filter to pass or reflect a part of the output light from the single-mode laser; and
a second monitor photo detector to receive the part of the output light from the single-mode laser, via the monitoring wavelength filter.

8. The optical signal generator according to claim 7, further comprising:
a wavelength filter, provided where the light passing through the reflecting mirror enters, to convert frequency modulation generated in accordance with the intensity modulation by the intensity modulator to intensity modulation; and
a third monitor photo detector to receive a part of light output via the wavelength filter.

9. The optical signal generator according to claim 7, wherein at least one of the first monitor photo detector and the second monitor photo detector is provided over a substrate over which at least one of the single-mode laser, the phase adjuster, and the intensity modulator is provided.

10. The optical signal generator according to claim 8, wherein at least one of the first monitor photo detector, the second monitor photo detector, and the third monitor photo detector is provided over a substrate over which at least one of the single-mode laser, the phase adjuster, and the intensity modulator is provided.

11. The optical signal generator according to claim 1, further comprising a control circuit to control the phase adjuster such that the frequency difference between the signal on state and the signal off state generated in accordance with the intensity modulation by the intensity modulator becomes a frequency difference corresponding to a bit rate.

12. The optical signal generator according to claim 11, further comprising a wavelength filter, provided where the light passing through the reflecting mirror enters, to convert frequency modulation generated in accordance with the intensity modulation by the intensity modulator to intensity modulation,
wherein the control circuit is configured to control the phase adjuster such that an extinction ratio of light output via the wavelength filter has a desired extinction ratio.

13. The optical signal generator according to claim 1, further comprising: a wavelength filter, provided where the light passing through the reflecting mirror enters, to convert frequency modulation generated in accordance with the intensity modulation by the intensity modulator to intensity modulation; and
a control circuit to perform a first control to match an oscillation wavelength of the single-mode laser with an operating wavelength of the wavelength filter, and perform a second control to control the phase adjuster such that an extinction ratio of light output via the wavelength filter becomes a maximum.

14. The optical signal generator according to claim 13, wherein the control circuit is configured to perform a third control to control the phase adjuster such that, when the frequency difference is not a desired frequency difference and is not a local maximum, the frequency difference becomes the desired frequency difference, and to control the intensity modulator to increase the extinction ratio when the frequency difference is the local maximum.

15. The optical signal generator according to claim 14, wherein the control circuit is configured to perform a forth control to control the intensity modulator such that the extinction ratio of the light output via the wavelength filter becomes equal to or greater than the desired extinction ratio when the frequency difference is equal to the desired frequency difference.

16. The optical signal generator according to claim 13, wherein the control circuit is configured to supply a dither signal having a bit rate slower than a bit rate of a modulated signal supplied to the intensity modulator so as to be superimposed on the modulated signal, and to perform the second control based on the dither signal.

17. The optical signal generator according to claim 16, wherein the control circuit is configured to perform a control to stop the supply of the dither signal to the intensity modulator after the control of the phase adjuster based on the dither signal is completed.

18. The optical signal generator according to claim 11, further comprising:
a first monitor photo detector to receive a part of the output light from the single-mode laser;
a monitoring wavelength filter to pass or reflect a part of the output light from the single-mode laser; and
a second monitor photo detector to receive the part of the output light from the single-mode laser, via the monitoring wavelength filter,
wherein the control circuit is configured to control the phase adjuster or the intensity modulator based on a signal from the first monitor photo detector and the second monitor photo detector.

19. The optical signal generator according to claim 18, further comprising:
a wavelength filter, provided where the light passing through the reflecting mirror enters, to convert frequency modulation generated in accordance with the intensity modulation by the intensity modulator to intensity modulation; and
a third monitor photo detector to receive a part of light output via the wavelength filter, wherein the control circuit is configured to control the phase adjuster or the intensity modulator based on a signal from the first monitor photo detector, the second monitor photo detector, and the third monitor photo detector.

20. A method of adjusting an optical signal generator, the method comprising:

disposing a single mode laser, and a reflecting mirror to define another cavity different from a cavity of the single-mode laser, and to reflect a part of output light from the single-mode laser to return the part of the output light to the single-mode laser, and disposing an intensity modulator and a phase adjuster between the single-mode laser and the reflecting mirror; and adjusting, with the phase adjuster, a frequency difference between a signal on state and a signal off state generated in accordance with intensity modulation by the intensity modulator.

* * * * *